United States Patent
Sanga et al.

(10) Patent No.: US 7,615,798 B2
(45) Date of Patent: Nov. 10, 2009

(54) SEMICONDUCTOR LIGHT EMITTING DEVICE HAVING AN ELECTRODE MADE OF A CONDUCTIVE OXIDE

(75) Inventors: Daisuke Sanga, Tokushima (JP); Takeshi Kususe, Tokushima (JP); Takahiko Sakamoto, Anan (JP); Hisashi Kasai, Anan (JP)

(73) Assignee: Nichia Corporation, Tokushima (JP)

( * ) Notice: Subject to any disclaimer, the term of this patent is extended or adjusted under 35 U.S.C. 154(b) by 445 days.

(21) Appl. No.: 11/091,915

(22) Filed: Mar. 29, 2005

(65) Prior Publication Data

US 2005/0212002 A1 Sep. 29, 2005

(30) Foreign Application Priority Data

Mar. 29, 2004 (JP) ............................. 2004-094514

(51) Int. Cl.
*H01L 29/22* (2006.01)
*H01L 29/24* (2006.01)
(52) U.S. Cl. ......................................... 257/99; 257/103
(58) Field of Classification Search .................. 257/96, 257/97, 99, E33.062–E33.065, 101–103
See application file for complete search history.

(56) References Cited

U.S. PATENT DOCUMENTS 6,870,191 B2    3/2005    Niki et al.

2003/0057444 A1   3/2003   Niki et al.
2004/0124422 A1   7/2004   Sakamoto et al.
2005/0001227 A1   1/2005   Niki et al.
2005/0139825 A1*  6/2005   Song et al. ..................... 257/44

FOREIGN PATENT DOCUMENTS

| JP | 6-291366 A | 10/1994 |
| JP | 8-264827 A | 10/1996 |
| JP | 10-321913 A | 12/1998 |
| JP | 2000-164922 A | 6/2000 |
| JP | 2001-210867 A | 8/2001 |
| JP | 2002-016287 A | 1/2002 |
| JP | 2002-246648 A | 8/2002 |
| JP | 2003-92427 A | 3/2003 |
| JP | 2003-318441 A | 11/2003 |
| JP | 2004-221529 A | 8/2004 |

* cited by examiner

*Primary Examiner*—Hung Vu
(74) *Attorney, Agent, or Firm*—Smith Patent Office

(57) ABSTRACT

A semiconductor light emitting device with improved efficiency in extracting light is provided. The semiconductor light emitting device comprises a first conductive type semiconductor layer, a light emitting layer, and a second conductive semiconductor layer stacked in this order, electrodes respectively connected to the first and second conductive semiconductor layers, the electrode connected to the second conductive type semiconductor layer comprising a lower conductive oxide film and an upper conductive oxide film disposed on the lower conductive oxide film, and a metal film disposed only on the upper conductive oxide film. The upper and lower conductive oxide films comprise an oxide including at least one element selected from the group consisting of zinc (Zn), indium (In), tin (Sn), and magnesium (Mg).

20 Claims, 13 Drawing Sheets

250
SEMICONDUCTOR LIGHT EMITTING DEVICE HAVING AN ELECTRODE MADE OF A CONDUCTIVE OXIDE

BACKGROUND OF THE INVENTION

1. Field of the Invention

The present invention relates to a semiconductor light emitting element device. In particular, the present invention relates to a semiconductor light emitting device having an electrode made of a conductive oxide.

2. Discussion of the Related Art

Semiconductor light emitting devices have been conventionally known in which a p-type semiconductor layer and an n-type semiconductor layer are stacked onto a substrate and electrodes are electrically connected to the respective p-type and n-type semiconductor layers. Also, an electrode that is electrically connected to the p-type semiconductor layer has been known in which an electrode made of a transparent material is formed on the entire surface of the p-type semiconductor layer and a metal electrode is formed thereon.

In the semiconductor light emitting device having such a configuration, a transparent thin metal film or a conductive oxide film of ITO (Indium Tin Oxide), ZnO, $In_2O_3$, $SnO_2$, or the like, is used as the electrode formed on the entire surface of the p-type semiconductor layer (see Reference 1: Japanese Laid-Open Publication Kokai No. 2000-164922 and Reference 2: Japanese Laid-Open Publication Kokai No. 2001-210867, for example).

However, poor transmittance of the thin metal film limits the improvement of the light extraction efficiency.

A conductive oxide film such as ITO has a transparency so that the light extraction efficiency is generally excellent. However, there has been a problem that sufficient light extraction efficiency cannot be obtained according to the thickness and the composition of the film.

Generally, a pad-electrode made of metal is disposed on the electrode made of a conductive oxide in order to connect to an external member such as a wire.

However, the pad electrode is relatively thick and impenetrable to light. Therefore, in addition to the problem that emitted light can not be extracted from the region having the pad electrode, light is absorbed by the pad electrode and the loss in extracting light increases.

SUMMARY OF THE INVENTION

The present invention was developed considering the problems described above. Thus, it is an object of the present invention to provide a semiconductor light emitting device wherein the light extraction efficiency from the light emitting layer is improved by using a transparent conductive oxide film, and further, the absorption of emitted light by the metal film that is usually used as the pad electrode is minimized, and at the same time, the reflection of light by the metal film is maximized, so that the light extraction efficiency from the entire light emitting layer is further improved.

A light emitting device according to the present invention comprises a first conductive type semiconductor layer, a light emitting layer, and a second conductive type semiconductor layer stacked in this order; and electrodes respectively connected to the first conductive type and the second conductive type semiconductor layers. The electrode connected to the second conductive type semiconductor layer comprises a lower conductive oxide film, an upper conductive oxide film disposed on the lower conductive oxide film so that a portion of a surface of the lower conductive oxide film is exposed, and a metal film disposed on the upper conductive oxide film. The upper conductive oxide film and the lower conductive oxide film each comprising an oxide including at least one element selected from the group consisting of zinc (Zn), indium (In), tin (Sn), and magnesium (Mg).

The semiconductor light emitting device of the present invention has an electrode connected to the first conductive type semiconductor layer comprising a conductive oxide film and a metal film disposed on the conductive oxide film, and the conductive oxide film included in the electrode connected to the first conductive type semiconductor layer comprises an oxide including at least one element selected from the group consisting of zinc (Zn), indium (In), tin (Sn), and magnesium (Mg).

The semiconductor light emitting device of the present invention includes where the upper conductive oxide film and the conductive oxide film of the first conductive type semiconductor layer have substantially the same composition and substantially the same thickness.

The semiconductor light emitting device of the present invention has a lower conductive oxide film having a thickness described by $$A \cdot \lambda / 4n_1 \pm X \tag{1}$$

(wherein A is an odd number, λ is a wavelength of light emitted from the light emitting layer (Å), $n_1$ is refractive index of the lower conductive oxide film, X is film thickness (Å) which is 0 to 20% of an optical thin film (λ/4n)).

In addition, the upper conductive oxide film has a thickness described by $$B \cdot \pi / 4n_2 + \alpha / 2 \tag{2}$$

(wherein B is an even number, λ is the wavelength of light emitted from the light emitting layer (Å), $n_2$ is the refractive index of the upper conductive oxide film, and α is distance of phase shift (Å)).

In addition, the lower conductive oxide film has a lower density adjacent to an interface with the second conductive type semiconductor layer than that adjacent to its surface.

Further, the upper conductive oxide film has a higher density than a portion of the lower conductive oxide film adjacent to an interface with the second conductive type semiconductor layer.

In addition, the upper conductive oxide film and the lower conductive oxide film are made of an indium tin oxide (ITO). The upper conductive oxide film and the conductive oxide film of the first conductive semiconductor layer are made of an indium tin oxide. The lower conductive oxide film is also made of ITO.

Furthermore, the metal film is at least one of a single-layer film and a multi-layer film made of W, Rh, Ag, Pt, Pd, and Al.

Additionally, the first conductive type semiconductor layer is an n-type semiconductor layer and the second conductive type semiconductor layer is a p-type semiconductor layer, and the semiconductor layer is a nitride semiconductor layer.

Furthermore, the first conductive type semiconductor layer is disposed on a substrate, and protrusions are disposed on at least a portion of an interface between the substrate and the first conductive type semiconductor layer.

Additionally, the protrusions are disposed on at least a surface of the substrate that is below the metal film disposed on the upper conductive oxide film.

In the present invention, the electrode connected to the first conductive type semiconductor layer and the electrode connected to the second conductive type semiconductor layer are disposed on a common surface side, and the first conductive type semiconductor layer comprises a first region provided with the stacked layer structure of a semiconductor having the upper conductive oxide film and the lower conductive oxide film and a second region that is different than the first region, and a plurality of protrusions are provided in the second region.

Further, the protrusions provided in the second region are made of substantially the same material as the semiconductor layer in the first region, and upper portions of the protrusions are made of substantially the same material as the lower conductive oxide film.

Further, it is preferable to have the following construction. The electrode connected to the first conductive type semiconductor layer and the electrode connected to the second conductive type semiconductor layer are formed on the same surface side. When viewed from the electrode forming surface side, the first conductive type semiconductor layer comprises a first region provided with a semiconductor stacked-layer structure having upper and lower conductive oxide films and a second region that is different from the first region. A plurality of protrusions are formed in the second region. It is especially preferable that the protrusions in the second region are layers made of the same materials as the semiconductor layer in the first region, and the top of a protrusion is a film made of the same material as the lower conductive oxide film.

The semiconductor light emitting device according to the present invention comprises electrodes made of specific conductive oxide films. The electrode connected to the second conductive type semiconductor layer comprises a lower conductive oxide film and an upper conductive oxide film that is disposed on the lower conductive film so as to expose a portion of the surface of the lower conductive film, and a metal film that is disposed only on the upper conductive oxide film. The electrode connected to the first conductive type semiconductor layer comprises a conductive oxide film and a metal film disposed on the conductive oxide film. With this construction, light emitted from the light emitting layer can be extracted efficiently from a region of the second conductive type semiconductor layer where the lower conductive oxide film is disposed thereon and the metal film is not disposed. In a region where the metal film is disposed, the reflection of light at the interface between the metal film and the upper conductive oxide film can be improved, so that the light extraction efficiency can be further improved. Moreover, the upper and lower conductive films are made of oxides including at least one element selected from the group consisting of zinc (Zn), indium (In), tin (Sn), and magnesium (Mg), so that the transparency can be improved while maintaining the conductivity. Thus, the above-described effect can be further enhanced.

Especially, in cases where the lower conductive oxide film has the specific thickness represented by the condition (1), the lower conductive film functions as an antireflection film to light of an emission wavelength in the region where the metal film is not disposed, so that the light can be transmitted effectively and the above-described effect can be further improved.

In addition, in cases where the upper conductive oxide film and the conductive oxide film are disposed in the same process so as to have the same composition and the same thickness, the manufacturing process can be simplified, and a highly reliable and inexpensive semiconductor light emitting devices can be obtained.

Further, the upper conductive oxide film and/or the conductive film are disposed with the specific thickness represented by the condition (2), the upper conductive oxide film functions as a reflection film with a high reflectivity to the light of the emission wavelength. Therefore, light can be reflected efficiently at the interface between the metal film and the upper conductive oxide film so that the light extraction efficiency can be further improved.

In addition, in cases where the lower conductive oxide film has a lower density in a portion adjacent to the interface with the second conductive type semiconductor layer than in another portion further from the surface, and where the upper conductive oxide film and the conductive oxide film have a higher density than that of the lower conductive oxide film adjacent to the interface with the second conductive type semiconductor layer, the current density between the second conductive type semiconductor layer and the lower conductive oxide film can be increased, the Schottky barrier can be reduced and the ohmic characteristics can be further improved. Further, a region adjacent to the surface in the lower conductive oxide film has a higher density than the region adjacent to the interface, and has a good crystallinity. With this, electric current can be dispersed uniformly in the lateral direction and at the same time, the scattering of light can be prevented, so that the transmission factor to visible light can be improved, and the function as the transparent electrode can be sufficiently brought out.

Furthermore, in cases where the upper and lower conductive oxide film and the conductive oxide film are made of ITO, the conductivity and the transmittance can be improved while maintaining the adhesiveness with the second conductive type semiconductor layer. Therefore, the light extraction efficiency can be further improved.

In addition, the metal film is disposed as a single-layer film or a stacked-layer film made of W, Rh, Ag, Pt, Pd, and/or Al. The adhesiveness between the upper conductive oxide film and the conductive oxide film is good, so that the supply of the electric current supply to the semiconductor layer can be sufficiently maintained. Besides, also its reflectivity is high. Thus, the light extraction efficiency from the light emitting layer can be further improved.

In cases where the first conductive type semiconductor layer is formed on the substrate and at least a part of the interface between the substrate and the first conductive type semiconductor layer is provided with recesses and protrusions, light traveling in the lateral direction within the semiconductor layer is scattered or refracted at the recesses and protrusions to the vertical direction. By this structure, the amount of light entering the interface between the metal film and the upper conductive oxide film can be increased, and the light extraction efficiency can be further improved.

Further, by disposing the electrode connected to the first conductive type semiconductor layer on the same surface side where the electrode connected to the second conductive type semiconductor layer is disposed, and forming a plurality of recesses and protrusions in the second region on the first conductive type semiconductor layer, light traveling in the lateral direction within the first conductive type semiconductor layer, that is, light traveling with a repetitive total reflection can be taken into the protrusions. This allows the light to be extracted from the top and the side surfaces of the protrusions in the vertical direction efficiently, especially toward the observation side.

In cases where the protrusions in the irregularity provided in the second region are the layers made of the same material as the semiconductor layer in the first region, or the top of the protrusions are made of the same materials as the lower conductive oxide film, light taken into the protrusions can be extracted efficiently.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Figure 1:
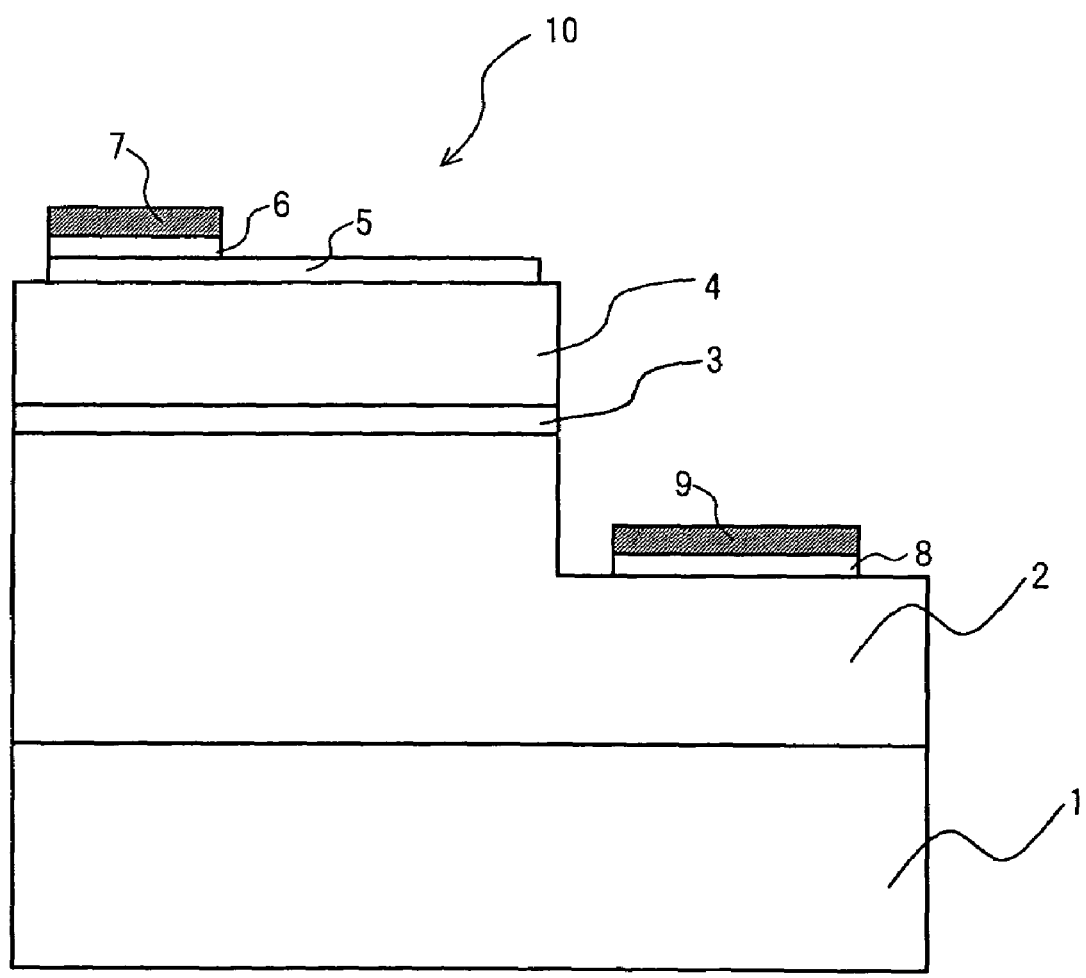
FIG. 1 is a cross-sectional view showing a semiconductor light emitting device according to an embodiment of the present invention.

A semiconductor light emitting device according to the present invention generally comprises a first conductive type semiconductor layer, a light emitting layer, and a second conductive type semiconductor layer stacked in this order, and electrodes connected to respective first conductive type and second conductive type semiconductor layers. The light emitting devices well known in this field include, for example, LEDs, laser diodes, and the like. Here, the first conductive type semiconductor layer means n-type or p-type semiconductor layer, and second conductive type layer means a conductive layer having a different conductive type than the first conductive type layer. In this specification, the first conductive type semiconductor layer may be described as the n-type semiconductor layer and the second conductive type semiconductor layer may be described as the p-type semiconductor layer.

The semiconductor layers comprising the first conductive type and second conductive type semiconductor layers and the light emitting layer are not particularly limited, and examples thereof include elemental substrates such as silicon, germanium, and the like, and compound semiconductors such as Groups III-V, Groups II-V, Groups VI-VI and the like. In particular, nitride semiconductors, and more particularly gallium nitride based compound semiconductors such as $In_xAl_yGa_{1-x-y}N$ ($0 \pm X$, $0 \pm Y$, $X+Y \pm 1$) and the like, are preferably employed. Each of such semiconductor layers and light emitting layer may have a single-layer structure, though, may have a stacked-layer structure with layers having different compositions and thickness, or a superlattice structure. Especially, it is preferable that the light emitting layer has a single quantum well structure or a multiquantum well structure, formed with stacked thin layers and causes quantum effect. Generally, such a semiconductor layer and light emitting layer may have a homo structure including MIS junction, PIN junction or PN junction, a hetero structure or a double hetero structure. The semiconductor layer can be formed by means of well-known technology, such as metal organic vapor phase deposition (MOVPE), metal organic chemical vapor deposition (MOCVD), hydride vapor phase epitaxy (HVPE), and molecular beam epitaxy (MBE). The thickness of the semiconductor layers and the light emitting layer are not particularly limited, and various thickness may be employed.

Known insulating substrates or conductive substrates such as sapphire, spinel, SiC, nitride semiconductor (for example, GaN), and GaAs etc. can be used as a substrate in forming the semiconductor light emitting device of the present invention. Especially, an insulating substrate is preferable.

In the case where the insulating substrate is not finally removed, both the p-side electrode and the n-side electrode are typically disposed on the same side of the semiconductor layer. In this case, either a face-up manner (i.e., the semiconductor layer side is the primary light extraction surface), or a flip-chip manner (mounted in a face-down manner, i.e., the substrate side opposite from the electrode is the primary light extraction surface) can be used in mounting. However, using a face-up manner in mounting is suitable. A metallization layer (bumps made of Ag, Au, Sn, In, Bi, Cu, or Zn etc.) that serves to connect to an external electrode is disposed on the respective p-type electrode and n-type electrode. Each metallization layer is respectively connected to a pair of positive and negative external electrodes disposed on the submount, and then wires etc. are applied to the substrate.

In cases where the insulating substrates are finally removed or the conductive substrates are used, as described above, the p-side electrode and the n-side electrode can be disposed on the same surface side of the semiconductor layer, or can be disposed on the different surfaces respectively.

The electrode provided on the second conductive type semiconductor layer of the present invention is, for example, disposed on the second conductive type semiconductor layer via a second conductive type contact layer, and comprising a lower conductive oxide film as an ohmic electrode, and for example, an upper conductive oxide film and a metal film as a pad electrode, stacked in this order.

Here, the second conductive type contact layer is used in order to improve the electric connection between the second conductive type semiconductor layer and the electrode, and usually made of a layer having a lower resistance than that of the second conductive type semiconductor layer. The second conductive type contact layer is, for example, formed by suitably selecting the above-described materials that are illustrated for the second conductive type semiconductor layer. The second conductive type contact layer may function as a cladding layer or other layers. A second conductive type dopant, for example, a p-type dopant, may be diffused in the contact layer, in order to reduce the resistance. The dopant is not specifically limited, and it is suitable to use elements having p-type conductivity according to the material of the contact layer. For example, in cases where the contact layer is made of a nitride semiconductor, i.e., GaN, AlN, InN, or mixed crystals thereof (e.g., $In_xAl_yGa_{1-x-y}N$, $0 \leq x$, $0 \leq y$, $x+y \leq 1$) etc., examples of the p-type impurities include, for example, Mg, Zn, Cd, Be, Ca, Ba, and the like, and Mg is specifically preferable. The doping concentration is, for example, about $1 \times 10^{18}$ cm$^{-3}$ or greater, and preferably about $1.5 \times 10^{20}$ cm$^{-3}$ to about $1 \times 10^{22}$ cm$^{-3}$. The doping of impurities may be performed at the same time as the film formation, or after the film formation by way of vapor diffusion, solid diffusion, ion implantation, and the like. The impurities may also be diffused from the adjacent p-type semiconductor layer.

Each upper and lower conductive oxide films is made of an oxide containing at least one element selected from the group consisting of zinc, indium, tin, and magnesium. Particular examples thereof include ZnO, $In_2O_3$, $SnO_2$, ITO (a complex oxide of In and Sn), and MgO etc. Among them, ITO film is especially preferable. The upper and lower conductive oxide films may be made of different materials, however, it is preferable that they are made of the same material.

The thickness of the lower conductive oxide film is not specifically limited, provided that the transparency is maintained. However, it is preferable that the lower conductive oxide film has a thickness represented by the condition (1), for example.

$$A \cdot \lambda/4n_1 \pm X \quad (1)$$

(where A represents an odd number, $\lambda$ is the wavelength of light emitted from the light emitting layer (Å), $n_1$ is the refractive index of the lower conductive oxide film, and X is the film thickness (Å) which is 0 to 20% of an optical thin film ($\lambda/4n$)).

With this, the reflection of the light emitted from the light emitting layer at the surface of the lower conductive oxide film (the interface between the conductive oxide film and air) can be controlled to minimum and the transmittance can be optimized. Thus, the light extraction efficiency can be improved.

The lower conductive oxide film is aimed to maximize the transmission of the light emitted from the light emitting layer, so that the thickness thereof is preferably about a multiple of an odd number of the optical thin film, that is represented by $\lambda/4n$. However, propagation of emitted light from the light emitting layer into the lower conductive oxide film is from the direction of 180° in random, so that about ±X of fluctuations in the thickness are allowable. X, the fluctuations in the thickness, in other words, a variation, is for example, about 0 to 20% of $\lambda/4n_1$.

It is preferable that the thickness of the upper conductive oxide film is, for example, described by the condition (2):

$$B \cdot \lambda/4n_2 + \alpha/2 \quad (2)$$

(where B represents an even number, $\lambda$ is the wavelength of light emitted from the light emitting layer (Å), $n_2$ is the refractive index of the upper conductive oxide film, and $\alpha$ is the distance of phase shift (Å)).

With this, transmission of the light emitted from the light emitting layer at the upper conductive oxide film can be maximized, and further, the reflection of the light emitted from the light emitting layer at the interface between the upper conductive oxide film and the metal film can be maximized. Thus, the light extraction efficiency can be improved. Here, in the condition (2), $\alpha$ can take any values from zero to the distance of the phase shift, however, it is preferable that $\alpha$ is equal to the value of the distance of the phase shift. The distance of the phase shift takes a negative value. This is because the phase of light reflected at the interface between the upper conductive oxide film and the metal film delays in relation to the phase of light entering the interface. With this, the reflex at the interface between the upper conductive film and the metal film can be maximized.

The distance $\alpha$ of the phase shift can be calculated according to the equation (3):

$$\alpha = \lambda \cdot \theta/2\pi \quad (3)$$

(where $\lambda$ is the wavelength of light emitted from the light emitting layer (Å), $\theta$ is the angle of phase shift (rad)). Here, the phase shift is adjusted by ½ of the distance of the phase shift from the thickness of the upper conductive oxide film, in consideration of reflection (as reciprocation) of the light at the metal film. In addition, the angle $\theta$ of phase shift is usually determined by the refractive index of the conductive oxide film and the complex index of refraction of the metal film. For example, $\theta$ is calculated according to the equation (4) below, that is described in the section 3.5, "Reflection and optical constant" in "Light and magnetism; revised edition" (Katsuaki Sato, Asakura Shoten).

$$\theta = \tan^{-1} \frac{-2n_0 k}{n^2 + k^2 - n_0^2} \quad (4)$$

(where $n_0$ is the index of refraction of the oxide film, n is the index of refraction of the metal film, and k is the attenuation coefficient of the metal film.)

Phase shift varies according to the kind of the metal film disposed on the upper conductive oxide film. For example, in the case where the metal film is made of Pt whose index of refraction n is 1.87 and attenuation coefficient k is 3.20, the phase difference is −0.95 (rad), and the distance of the phase shift (optical path difference) is −336 Å, so that the calculated value of $\alpha/2$ will be about −168 Å. In a similar fashion, in the case of Rh, the index of refraction n is 1.73 and attenuation coefficient k is 4.50, the phase difference is −0.77 (rad), and the distance of the phase shift (optical path difference) is −275 Å, so that the calculated value of $\alpha/2$ will be about −137 Å. In the case of W, the index of refraction n is 3.31 and attenuation coefficient k is 2.55, the phase difference is −0.67 (rad), and the distance of the phase shift (optical path difference) is −239 Å, so that the calculated value of $\alpha/2$ will be about −119 Å. In the case of Ag, the index of refraction n is 0.14 and attenuation coefficient k is 2.56, the phase difference is −1.35 (rad), and the distance of the phase shift (optical path difference) is −481 Å, so that the calculated value of $\alpha/2$ will be about −240 Å.

As described above, by considering the distance of phase shift in the thickness of the upper conductive oxide film, the reflection occurs at the interface between the upper conductive oxide film and the metal film can be set high. Furthermore, by setting the interface between the upper conductive oxide film and the metal film at the maximum point or its adjacency in the wave of light, the fluctuations in the phase shift due to reflection of light from the light emitting layer can be prevented to the minimum, so that the light extraction efficiency can be further improved.

It is preferable that the upper and lower conductive oxide films constructing the electrode can efficiently transmit not only visible light but also, for example, light emitted from the light emitting layer of the above described gallium nitride based compound semiconductors. In other words, it is preferable that light having wavelength between about 360 nm to 650 nm, preferably from 380 nm to 650 nm or from 400 nm to 600 nm is not absorbed and transmitted efficiently, for example, with the transmittance of 90% or greater, 85% or greater, or 80% or greater. With this, the upper and lower conductive oxide films can be used as an electrode of a semiconductor light emitting device having a desired wavelength. Furthermore, the upper and lower conductive oxide films preferably have a specific resistance of $1 \times 10^{-4}$ Ωcm or less, and more preferably about from $1 \times 10^{-4}$ to $1 \times 10^{-6}$ Ωcm. With this, the conductive oxide films can be used effectively as an electrode.

The upper and lower conductive oxide films can be formed by way of known methods in this field. A variety of methods can be used. Examples of such methods include example, sputtering, reactive sputtering, vacuum evaporation, ion beam assist evaporation, ion plating, laser ablation, CVD, spraying, spin coating, dipping, and a combination of these methods and a heat treatment.

Here, the lower conductive oxide film preferably has a lower density at a portion, for example, the interface with the p-type contact layer, than that in the surface side and also the upper conductive oxide film. In other words, it is preferable that a portion adjacent to the interface with the second conductive type semiconductor layer is in a porous state. In the porous portion, for example, a plurality of pores about 20 to 200 nm in diameter are contained either homogeneously or nonhomogeneously. The density of the porous portion is, for example, about 90 to 30% of that of the surface side portion and/or the upper conductive oxide film. The state of the lower conductive oxide film described above can be measured, for example, by observing a cross-section thereof by transmission electron microscopy (TEM) or scanning electron microscopy (SEM), measuring the electron diffraction pattern thereof, or observing by using a super-thin film evaluation machine.

Here, the surface side in the lower conductive oxide film and the upper conductive oxide film are transparent films with good crystallinity. On the contrary, the second conductive type semiconductor layer side of the lower conductive oxide film may partially include amorphous regions, however, it is preferably formed as a transparent film or almost transparent film not in a complete amorphous state.

It is suitable that the region with low density in the lower conductive oxide film occupies, for example, 10 to 100%, preferably 10 to 50% of the total thickness of the upper conductive oxide film from the interface with the p-side contact layer. As described above, the lower conductive oxide film has a lower density in the portion adjacent to the interface with the p-type contact layer than that in the portions adjacent to the surface and the upper conductive oxide film, so that the transparency can be improved while maintaining the ohmic characteristic with the p-type contact layer.

When the lower conductive oxide film having varying density or the upper and the lower conductive oxide films having different densities, e.g., an ITO film, is to be formed by sputtering, methods that can be employed include a method in which the sputter gas is switched from one having a small or zero oxygen partial pressure to one having a large oxygen partial pressure, or in which the oxygen partial pressure is gradually increased, a method in which a target having a large amount of In or a target having a small amount of oxygen is employed in addition to a target used for ITO film formation, and the target having a large amount of In or the target having a small amount of oxygen is switched during film formation, or a method which gradually or rapidly increases the input power of the sputter device during film formation.

Furthermore, other methods below can be employed. In a method to form the lower conductive oxide film or the lower and upper conductive oxide films by way of ion plating, oxygen gas is transformed into plasma during film formation and the oxygen plasma is incorporated into the ITO film. A method in forming the ITO film by dissolving or dispersing and suspending microparticles of ITO in a solvent and form a film by employing spray method, spin coat method, or dip coat method, two kinds of solvents in which the indium content or oxygen content is varied in the solvent containing ITO, or the atmosphere and temperature etc. are controlled during drying or firing. In a method to form an ITO film by way of CVD method, the flow rate of an oxygen gas or a raw material gas containing oxygen is controlled.

In addition, after the lower conductive oxide film or the upper conductive oxide film is formed, an annealing process may be performed in an atmosphere of a reducing gas (more specifically, carbon monoxide, hydrogen, argon, or the like, or a mixture of two or more of these gases), at a temperature of about 200 to 650° C., and for a period of time determined according to the thickness of the film. In addition, a multistep heat treatment may be employed in which a heat treatment is performed after the lower conductive film is partially formed, and then the film formation is completed and a heat treatment is performed. Examples of heat treatment methods include lamp annealing and annealing that uses a heating furnace. In addition, electron beam irradiation or laser ablation may be used as a processing after the ITO film is formed. Furthermore, these methods may be combined at will.

The lower conductive oxide film described above is usually disposed as an electrode that covers approximately the entire surface of the second conductive type semiconductor layer. However, in some cases, it is difficult to obtain ohmic characteristic on the p-side contact layer made of the p-type semiconductor layer. However, by forming the conductive oxide film with a low density in the semiconductor layer side, excellent ohmic characteristic with the p-type semiconductor layer and/or the p-side contact layer can be established. The lower conductive oxide film is preferably disposed on approximately the entire surface of the second conductive type semiconductor layer. However, dot-shaped or stripe-shaped apertures can be formed in the lower conductive oxide film. Those apertures can be distributed either regularly or at random.

The upper conductive oxide film is disposed on the lower conductive oxide film. A part of the upper conductive layer may be located on the lower conductive oxide film and a part of the upper conductive layer may be located directly on the p-type semiconductor layer. However, it is preferable that the entire portion of the upper conductive layer is placed on the lower conductive oxide film without being in touch with the second conductive type semiconductor layer. The upper conductive oxide film may also be disposed so as to cover approximately the entire surface of the lower conductive oxide film. However, it is preferable that the upper conductive oxide film is placed so as to expose a part of the surface of the lower conductive oxide film. In other words, the upper conductive film is preferably disposed on the upper conductive film only in the region where the metal film that is described later to be disposed. The shape of the upper conductive oxide film is not particularly limited, and for example, a polygonal shape such as circular, triangular, quadrangular, or indeterminate forms can be used. The size of the upper conductive oxide film is not specifically limited, and a size that allows the metal film described later to appropriately connect to the upper conductive layer or to the lower conductive oxide film via the upper conductive layer is suitable. Especially, it is preferable that the upper conductive oxide film has the same shape and size as the metal film described later.

The metal film constructing the electrode connected to the second conductive type semiconductor layer can function as an electrode that is bonded by using a solder or by way of wire bonding. The type and form of the metal film are not specifically limited, and in general, any type and form of metal film can be used provided that it is used as an electrode. For example, a single-layer film or a stacked-layer film of metals such as zinc (Zn), nickel (Ni), platinum (Pt), palladium (Pd), rhodium (Rh), ruthenium (Ru), osmium (Os), iridium (Ir), titanium (Ti), zirconium (Zr), hafnium (Hf), vanadium (V), niobium (Nb), tanatnium (Ta), cobalt (Co), iron (Fe), manganese (Mn), molybdenum (Mo), chromium (Cr), tungsten (W), lanthanum (La), copper (Cu), silver (Ag), yttrium (Y), and the like, or alloy thereof, may be used. Here, those with low resistance are preferred, and examples thereof include a single-layer film or a stacked-layer film or an alloy of W, Rh, Ag, Pt, Pd, Al, Ti, or the like. Further, metal films having excellent adhesiveness with the upper conductive oxide film such as an ITO film are preferable, and specific examples thereof include a single-layer film or a stacked-layer film of W, Rh, and Pt. In addition, the metal film having good reflection characteristic such as a single-layer film or a stacked-layer film of W, Rh, and Pt are preferable.

Examples of the metal film include an Rh (or Al)/Pt/Au electrode (having respective thickness of, for example, 100 nm/200 nm/500 nm) stacked in this order by respectively sputtering Rh or Al, Pt, and Au from the semiconductor layer side, a Pt/Au electrode (having respective thickness of, for example, 200 nm/700 nm) stacked in this order by respectively sputtering Pt and Au from the semiconductor layer side. Good connection with a conductive wire etc. whose main component is Au can be secured by forming the top layer of the metal film with Au. In addition, by stacking Pt between Rh and Au, the diffusion of Au or Rh can be prevented, and a highly reliable electrical connection can be obtained as an electrode. In addition, Rh can be preferably employed because it has superior light reflectivity and barrier property and improve the light extraction efficiency. Here, a stacked-layer film of Pt/Au (in case of face up mounting) is specifically preferable.

The metal film is disposed only on the upper conductive oxide film. That is, the entire portion of the metal film is placed on the upper conductive oxide film in a manner so as not directly in contact with the lower conductive oxide film. The shape of the metal film is not specifically limited, and for example, a polygonal shape such as circular, triangular, quadrangular, or indeterminate forms can be used. The size of the metal film is not specifically limited. However, it is necessary to set a size with which the metal film can supply electric current efficiently to the upper and lower conductive oxide films, and furthermore, to the second conductive type semiconductor layer, and at the same time, the absorption of light emitted from the light emitting layer can be controlled to the minimum and light can be extracted efficiently. To be specific, the suitable size is approximately 30 to 70% of the area of the light emitting surface.

Figure 2:
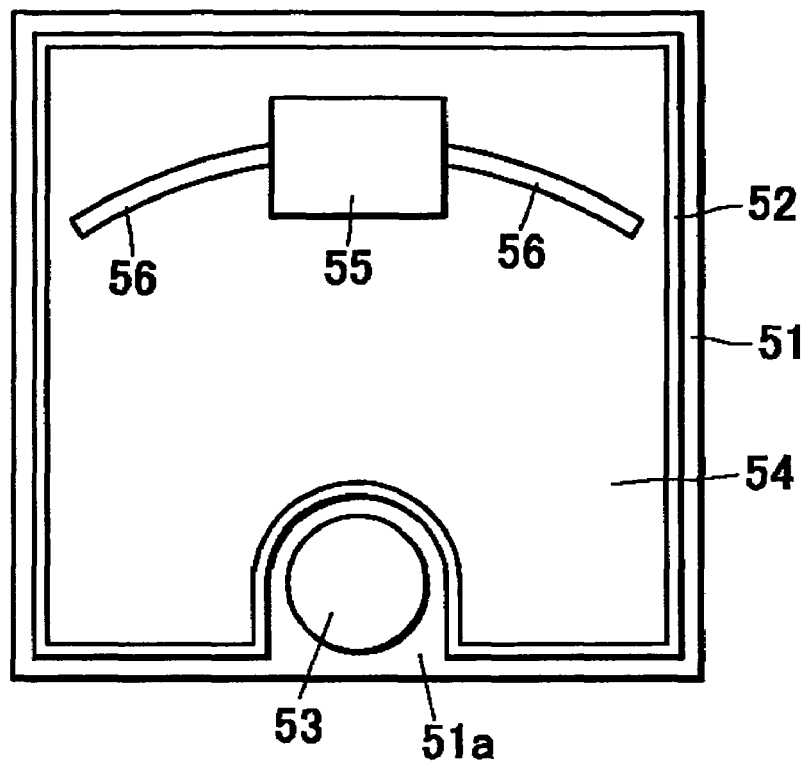
FIG. 2 is a plan view which describes the shapes of the electrodes of the semiconductor light emitting device according to an embodiment of the present invention.
Figure 3:
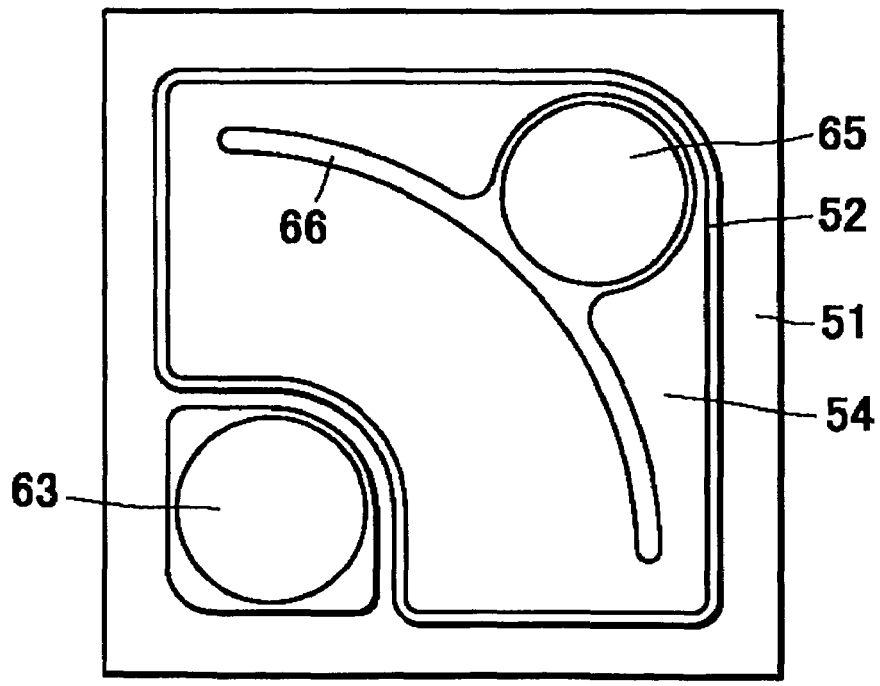
FIG. 3 is a plan view which describes another shape of the electrodes of the semiconductor light emitting device according to another embodiment of the present invention.
Figure 4:
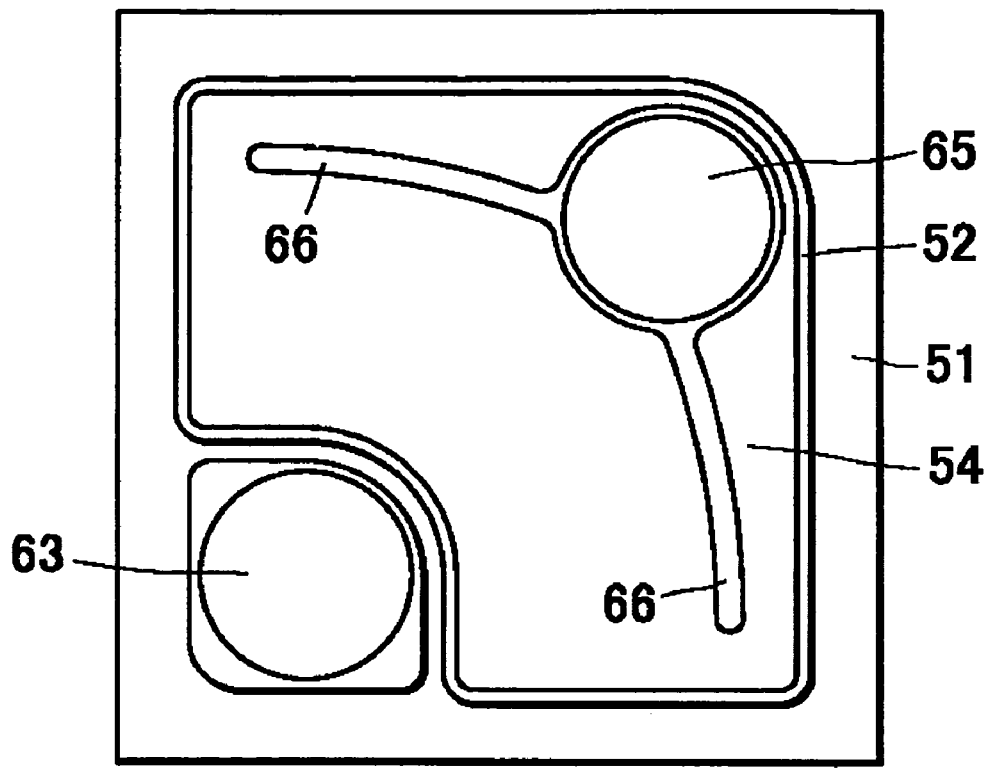
FIG. 4 is a plan view which describes still another shape of the electrodes of the semiconductor light emitting device according to another embodiment of the present invention.

As shown in FIGS. 2 to 4 are examples of how the metal film can be formed with extended conductive portions.

With this configuration, electric current can be supplied to the entire light emitting layer so that efficient emission can be obtained. It is especially effective in cases where the semiconductor light emitting device is mounted in a face-up manner.

Specifically, as shown in FIG. 2, the p-side electrode connected to the p-type semiconductor layer 52 comprises a lower conductive oxide film 54 disposed on the approximately entire surface of the p-side contact layer 52, an upper conductive oxide film (not shown) disposed adjacent portion to an edge that is an opposite edge adjacent to the n-side electrode 53, and a metal film 55 disposed approximately the same shape as the upper conductive oxide film. The upper conductive oxide film and the metal film 55 are extended outwardly from the both sides of the upper conductive oxide film and the metal film 55, as two linear extended conductive portions 56. With this configuration, the light emitting layer located between the metal film 55 and the n-side electrode 53 can emit light efficiently. Further, by electrically well connecting the extended conductive portions 56 extended from the metal film 55 onto the lower conductive oxide film 54, the electric current can diffuse effectively to the entire portion of the p-type semiconductor layer, so that the entire light emitting layer can emit light efficiently. In addition, emission with high brightness can be obtained from the adjacent portions to the metal film 55 and the extended conductive portions 56.

It is preferable that an interval is left between the extended conductive portion 56 and the edge of the p-layer so as to secure a peripheral region capable of obtaining the emission with high brightness described above. In the case where the sheet resistance Rn $\Omega/\square$ of the n-type contact layer 51 and the sheet resistance Rp $\Omega/\square$ of the lower conductive oxide film 54 satisfy the relationship Rp$\geq$Rn, the interval between the extended conductive portion 56 and the p-layer is preferably about 20 to 50 µm. This is because if the interval is smaller than 20 µm, sufficient peripheral region from which a high luminance is obtained cannot be secured (in other words, the region from which emission of high luminance can be obtained extends beyond the outer sides thereof), and if the interval is wider than 50 µm, a region having emission of low luminance occurs along the adjacent area, and thus causes the decrease in the overall luminance.

The two extended conductive portions 56 can be formed either in a linear shape or in an arc shape so as to be equidistant from the n-side electrode 53 as shown in FIG. 2. Especially, it is preferable to form them in an arc shape, because further uniform luminescence distribution can be obtained.

In addition, the n-side electrode connected to the n-type semiconductor layer described later is disposed so as to be adjacent to at least one edge of the semiconductor light emitting device. For example, a cut-in portion 51a, from where the n-side contact layer 51 is exposed, is formed by removing a portion that is a mid-portion adjacent to an edge of both the p-type semiconductor layer and the light emitting layer by way of etching, and then the n-side electrode 53 is disposed on the cut-in portion 51a. Here, the n-side electrode 53 comprises the conductive oxide film (not shown) and the metal film formed thereon in the same shape.

Further, as shown in FIG. 3 and FIG. 4, it is preferable that the n-side electrode described later is disposed so as to be adjacent to two edges in a corner of the semiconductor light emitting device, and the upper conductive oxide film (not shown) and the metal film 65 that construct the p-side electrode are disposed in the opposite corner from the corner adjacent to the n-side electrode 63.

In addition, the two extended conductive portions 66 continuing from the metal film 65 are preferably formed in an arc shape so as to be equidistant from the n-side electrode 63. Thus, a luminance with a higher intensity and uniformity can be obtained. Here, also in this case, it is preferable that the interval between the extended conductive portion 66 and the edge of the p-layer is about 20 to 50 μm.

According to the present invention, generally, in a part of the semiconductor light emitting device, the second conductive type semiconductor layer and the light emitting layer, and an arbitrary depth of the first conductive type semiconductor layer are removed so as to partially expose the surface of the first conductive type semiconductor layer. Then an electrode is formed on the exposed surface of the first conductive type semiconductor layer (hereinafter referred to as "second region"). This electrode is, for example, formed on the first conductive type semiconductor layer via the first conductive type contact layer, and comprises the conductive oxide film and the metal film stacked in this order. The electrode connected to the first conductive type semiconductor layer may be formed on the rear surface side of the first conductive type semiconductor layer via the first conductive type contact layer. Especially, in cases where the semiconductor light emitting device is formed on a conductive substrate, usually the conductive substrate and the first conductive type semiconductor layer are electrically connected. Therefore, it is preferable that the conductive oxide film and the metal film are electrically connected to the first conductive type semiconductor layer via the conductive substrate etc.

Here, The layers shown as examples as the second conductive type semiconductor layer etc. can be employed as the first conductive type semiconductor layer and the first conductive type contact layer etc. provided that the conductive type is different.

In this specification, the second region means in the stacked-layer structure comprising the first and second conductive type semiconductor layers that is constructing a semiconductor light emitting device, a region other than the surface region of the second conductive type semiconductor layer where the upper and lower conductor oxide films and the metal film are disposed.

In the present invention, it is necessary that the conductive oxide film is disposed in the region where the light propagating from the light emitting layer directly hits. Therefore, it is acceptable even in the case where the conductive oxide film is not always disposed on the first conductive type semiconductor layer, and only the metal film is formed thereon, providing that the upper and the lower conductive oxide films are disposed at least on the second conductive type semiconductor layer. However, the electrode connected to the first conductive type semiconductor layer preferably comprises the conductive oxide film and the metal film.

Similar materials as the upper and lower conductive oxide films can be used as the conductive oxide film. Here, the conductive oxide film may comprise either a single layer or a multilayer in which two or more layers are stacked. However, it is not necessarily the case that the conductive oxide film is made of the same materials as of either the lower conductive oxide film or the upper conductive oxide film, or both of them. By disposing the conductive oxide film on the first conductive type semiconductor layer, the adhesiveness between the first conductive type semiconductor layer and the conductive oxide layer can be further improved so that the ohmic characteristic can be obtained. Especially, in the case where the electrode comprises the lower conductive film, the upper conductive film, and the metal film, the transmission factor of light can be increased and the efficiency of reflection at the interface between the upper conductive oxide film and the metal film can also be improved.

Similar metal film as described above can be used as the metal film. The metal film disposed on the first conductive type semiconductor layer is not necessarily the same as the metal film disposed on the second conductive type semiconductor film.

The conductive oxide film and/or the metal film formed on the first conductive type semiconductor layer and the upper oxide film and/or the metal film formed on the second conductive type semiconductor layer are preferably made of the same material and with the same thickness. Moreover, it is preferable that those films are formed in the same process. If those films are formed with the same structure, they can be fabricated in the same process. Therefore, the manufacturing process can be simplified, and a highly reliable and inexpensive semiconductor light emitting device can be obtained.

In the semiconductor light emitting device according to the present invention, as described above and shown in FIG. 5, a plurality of recesses and protrusions may be formed in a part of the surface in the second region from where the first conductive semiconductor layer is exposed. Here, a portion between adjacent two protrusions may be described as a recess. Although recesses and protrusions may be formed in the portion directly under the electrode, it is preferable that they are formed in the second region but other than the portion where the electrode is disposed.

Figure 5:
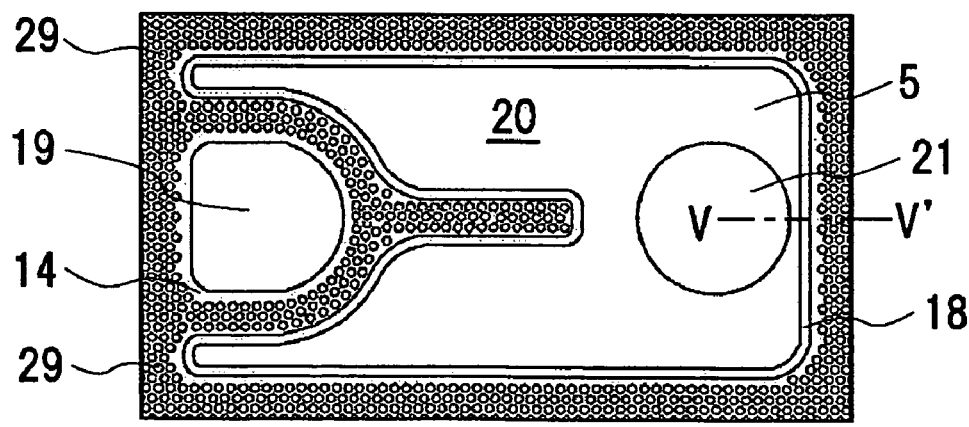
FIG. 5 is a plan view showing a semiconductor light emitting device according to another embodiment of the present invention.

In particular, the recesses and protrusions are preferably formed in the adjacent region of the light emitting device (circumference region of the first region) and/or the adjacent region of the electrode. Especially, as shown in FIG. 5, emission of light in the region adjacent to the n-side electrode 19 is relatively strong, and thus by providing the protrusions between the n-side electrode 19 and the lower conductive oxide film 5, the light extraction efficiency can be further improved. Furthermore, for example, a plurality of protrusions may be provided in a high density in the regions, such as the regions adjacent to the n-side electrode and the first region, where the emission of light is relatively strong, and a plurality of protrusions may be provided in a low density in the different regions where the emission of light is relatively weak. By varying the density of a plurality of protrusions in consideration of the strength of the light emission region, more effective light extraction and directivity control become possible.

Here, it is sufficient that the tops of the protrusions are at least higher than that of the electrode-forming surface. With this, the light extraction efficiency can be improved.

Figure 6:
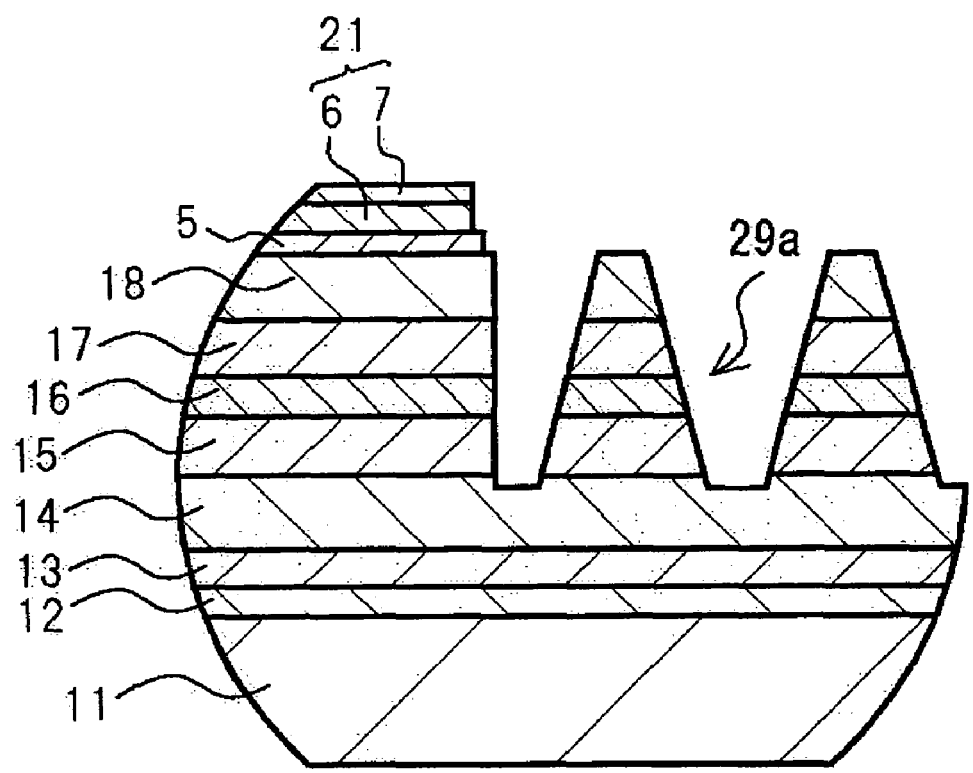
FIG. 6 is a partial cross-sectional view taken along line V-V' in FIG. 5.

For example, the tops of the protrusions are only required to be higher than the interface between the light emitting layer and the adjacent n-type semiconductor layer. As shown in FIG. 6 as the protrusion 29*a*, the tops of the protrusions are more preferably located closer to the second conductive type semiconductor layer than the light emitting layer, or at substantially the same height as the p-type semiconductor layer. The protrusion 29*a* shown in FIG. 6, includes the layers from the n-type contact layer to the p-type contact layer. With this configuration, the surface area of the side surfaces of the protrusions increases, so that light propagating within the n-type semiconductor layer increasingly hits the side surfaces of the protrusions. Thus, the amount of light that is totally reflected within the protrusions decreases. Moreover, light emitted from the light emitting layer in the lateral direction is directly reflected at the protrusions and changes its direction toward the light emission observation side, so that the light extraction efficiency toward the light emission observation side can be increased, for example, by 10 to 20%.

It is thought that this improvement is achieved by the following factors:

(1) Light propagating within the n-type semiconductor layer (for example, n-side contact layer) is taken into the protrusions from the n-side contact layer, and extracted from the top or the side surfaces of the protrusions toward the light emission observation side.

(2) Light emitted from the end surface of the light emitting layer is reflected and scattered at a plurality of the protrusions and then extracted toward the light emission observation side.

(3) Light propagating within the n-side contact layer is reflected randomly at the bottom of the protrusions (connecting portion between the n-side contact layer and the protrusions) and then extracted toward the light emission observation side.

Figure 7:
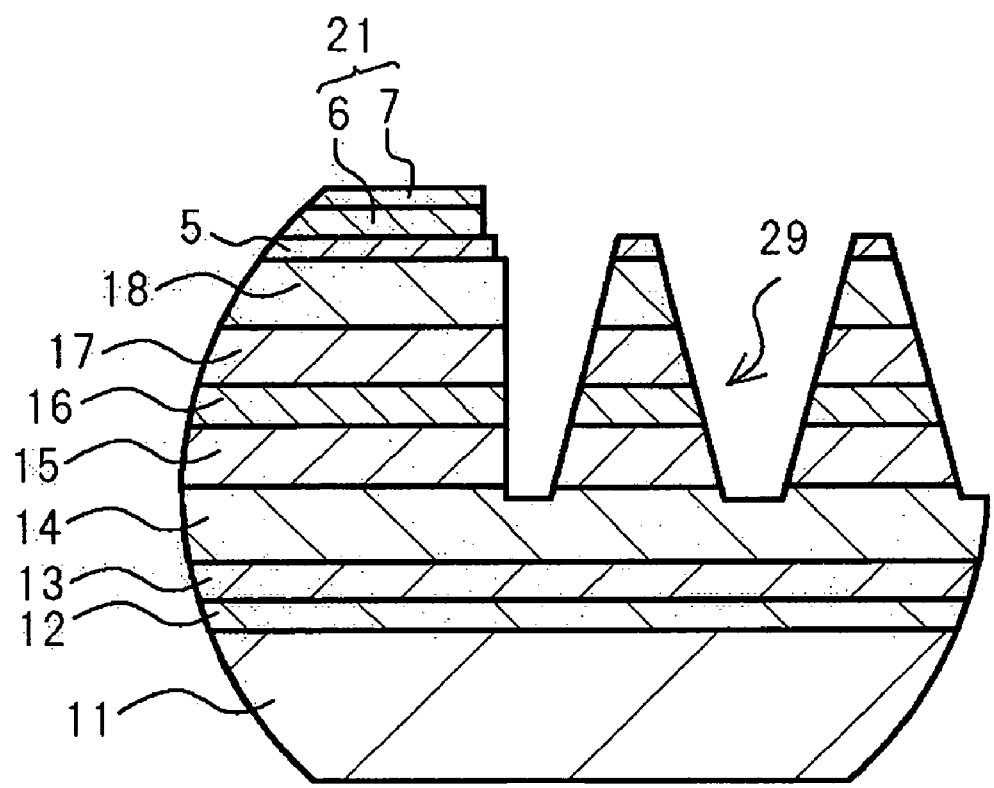
FIG. 7 is a partial cross sectional view showing a semiconductor light emitting device according to still another embodiment of the present invention.

Alternatively, as shown in FIG. 7 as the protrusion 29, it is more preferable that the protrusions are formed substantially the same height as the lower conductive film. The protrusion 29 shown in FIG. 7 includes the layers from the n-type contact layer to the lower conductive oxide film. In this case, generally, the tops of the protrusions comprise the lower conductive film. Thus, by forming the tops of the protrusions with the lower conductive oxide film that is a thick film through which light transmits easily, light taken into the protrusions can be extracted easily toward the light emission observation side.

Figure 8:
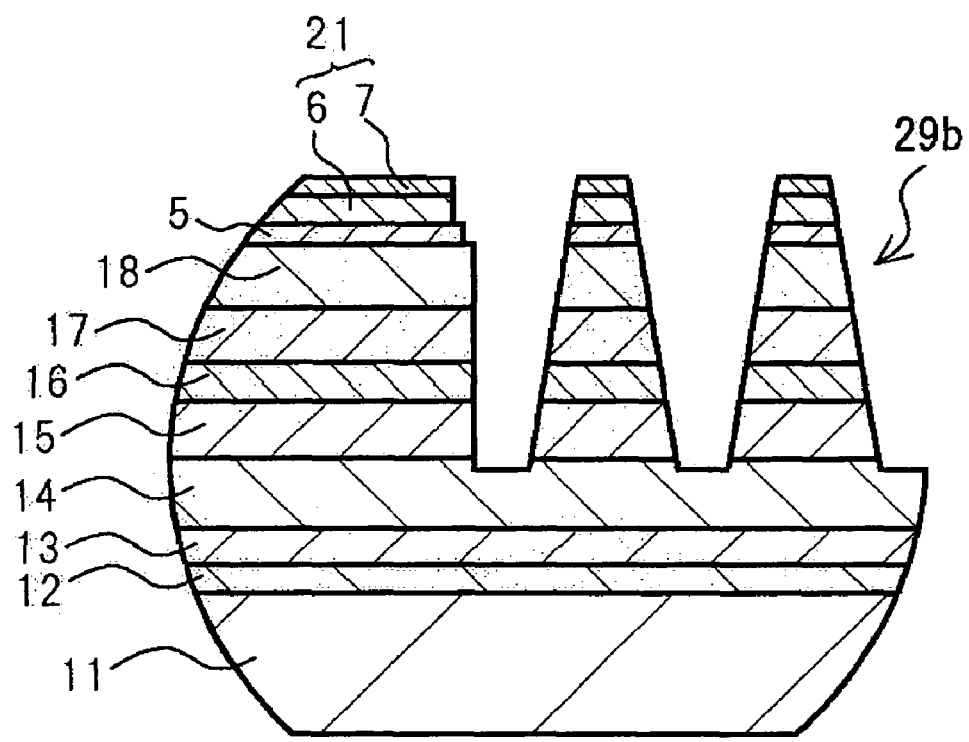
FIG. 8 is a partial cross sectional view showing a semiconductor light emitting device according to yet another embodiment of the present invention.

Alternatively, as shown in FIG. 8 as the protrusion 29b, the protrusions may have substantially the same height as the upper conductive oxide film.

The protrusion 29b shown in FIG. 8 includes the layers from the n-type contact layer to the metallic film. In addition, it is preferable that the lower conductive oxide film at the tops of the protrusions have a plurality of voids or pores or a lower density than the surface side of the lower conductive type oxide film in the portion adjacent to the p-type semiconductor layer. With this construction, light propagating within the protrusions can be scattered toward the top thereof.

Alternatively, as shown in FIG. 8, the protrusions may have substantially the same height as the metal film. Here, the tops of the protrusions is formed with the metal film so that light taken into the protrusions from the n-type semiconductor layer is reflected at the interface between the metal film and the semiconductor layer toward the substrate side. Thus, this configuration is suitable, for example, in cases where the substrate side is used as the principal light extraction surface. The bottom of the recess that is the interval of the protrusions is only required to be at least lower than the interface between the light emitting layer and the adjacent second semiconductor layer. It is preferable that the bottom of the recesses is lower than the light emitting layer.

Although the density of the recesses and the protrusions is not specifically limited in the present invention, it is preferable that the number thereof in a semiconductor light emitting device is 100 or more, more preferably 300 or more, and further preferably 500 or more. When viewed from the electrode forming surface side, the proportion of the area that the region having the recesses and protrusions occupies may be 10% or more, preferably 30% or more. Additionally, the area of base of a protrusion may be 3 to 300 µm$^2$.

The protrusions may have any cross-sectional shapes such as a triangle, a quadrangle, a trapezoid, and a semicircle etc. The protrusions may have any planar shapes such as a circle, a diamond, a triangle, and a hexagon etc. Especially, the protrusions preferably have a circular truncated cone shape with a narrower top than its bottom. The angle of the inclination of the protrusions may be, for example, 30° to 80°, and preferably 40 to 70°, as shown in FIG. 6. With this configuration, directional control of light can be made easier and more uniform light extraction as a whole becomes possible. Also, it is thought that an increase in the surface area of the protrusions contributes to the improvement of the light extraction efficiency. Further, by forming the protrusions in a tapered shape with a narrower top than its bottom, the surface area of the top thereof decreases, so that amount of light totally reflected at the top decreases. This is also thought as a contribution to the improvement of the light extraction efficiency.

The recesses and protrusions can be formed by way of specific process for forming the recess and protrusions in which, for example, the semiconductor layers are grown on the exposed surface of the n-type semiconductor layer. However, it is preferable that the recesses and protrusions are formed through the use of other processes such as a process to expose the n-type semiconductor layer or a process to make the pre-determined region thinner in preparation for dividing into chips.

For example, a mask exposing predetermined shapes such as a circle, a triangle, and quadrangle etc., is disposed on the surface of the n-type semiconductor layer and recesses are formed by way of RIE (reactive ion etching). Alternatively, protrusions can be formed by using a mask covering predetermined shapes. The protrusions can also be formed.

After stacking the p-type semiconductor layers, a mask covering desired portions that includes the light emitting layer which functions as the light emitting device, the portion on the surface of the p-type semiconductor layer where the electrode to be disposed on, and the portions where the protrusions to be formed, is disposed and etching is carried out. Thus, the protrusions can be made. With this, the process can be simplified.

In the semiconductor light emitting device of the present invention, recesses and protrusions can be provided in at least a part of the interface between the substrate and the semiconductor layer. Here, a portion between adjacent two protrusions may be described as a recess. With this, light traveling within the semiconductor layer in a lateral direction can be scattered or diffracted at the recesses and protrusions so that the traveling direction of the light can be changed into a vertical direction. Therefore, the amount of light totally reflected at the surface of the lower conductive oxide film and at the interface between the metal film and the upper conductive oxide film can be reduced. Here, the recesses and protrusions in the interface between the substrate and the semiconductor layer means the recesses and protrusions formed in the surface of an insulating substrate or a conductive substrate, and the recesses and protrusions occurred in the surface of a buffer layer or an intervening layer etc, formed on such a substrate due to the recesses and protrusions on the substrate.

Figure 9A:
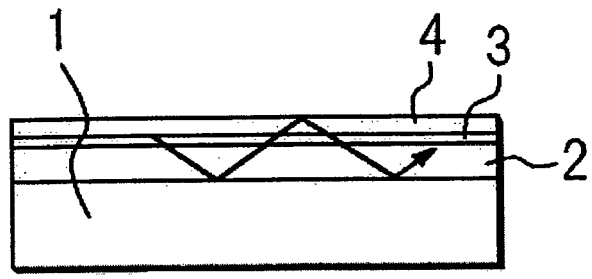
FIGS. 9A to 9D are partial cross sectional views describing directions of light in the semiconductor light emitting devices according to the present invention.
Figure 9B:
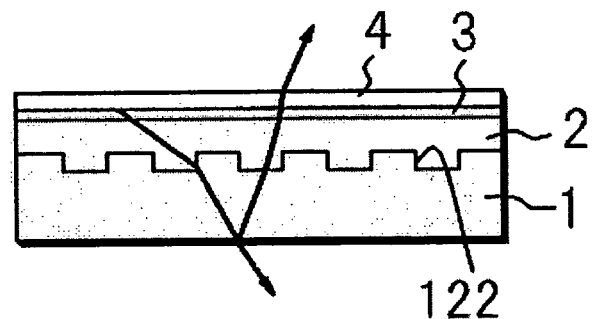

As shown in FIG. 9A, in cases where a semiconductor light emitting device has a flat substrate, when light from the light emitting region 3 enters the interface between the p-type semiconductor layer 4 and the electrode, or the surface of the substrate 1 at an angle larger than the critical angle, the light will be trapped within the wave guide so that it will propagate in the lateral direction. On the contrary, as shown in FIG. 9B, when the recesses and protrusions are provided in the surface of the substrate, light entering the interface between the p-type semiconductor layer 4 and the electrode, or the surface of the substrate 1 at an angle larger than the critical angle will be scattered or refracted at the protrusions 122, and enters the interface between the p-type semiconductor layer 4 and the electrode, or the surface of the substrate 1 at an angle smaller than the critical angle.

Figure 10:
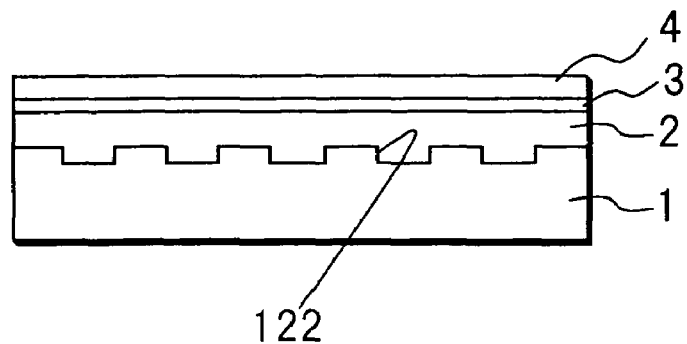
FIG. 10 is a partial cross sectional view showing a semiconductor light emitting device according to yet another embodiment of the present invention.
Figure 11A:
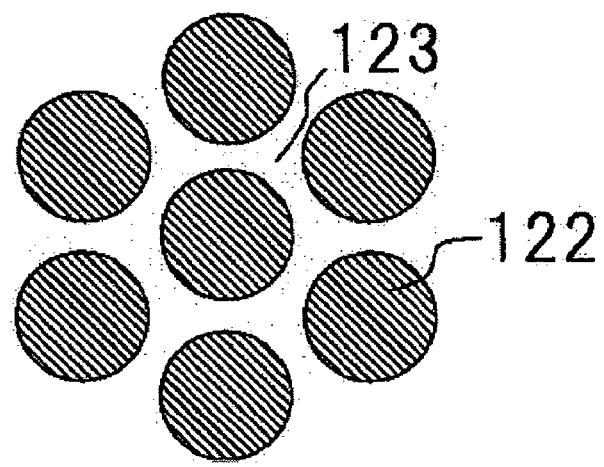
FIGS. 11A and 11B are views showing examples of a pattern of the protrusions shown in FIG. 10.
Figure 11B:
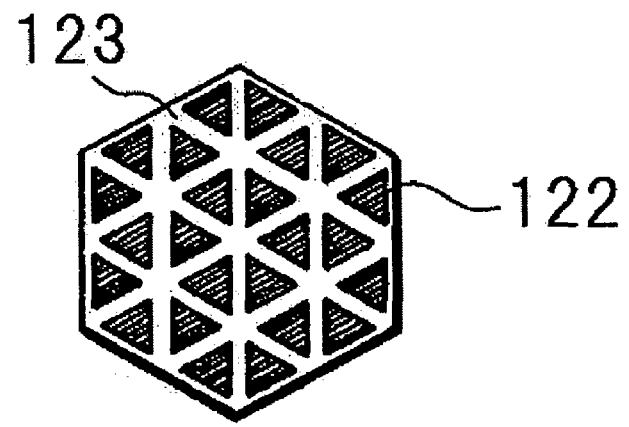

The recesses and protrusions may be the protrusions formed in a repeated pattern as below. For example, as shown in FIG. 10, a C-plane (0001) sapphire substrate having an orientation flat in the A plane (11-20) is used as a substrate, and the protrusions 122 (or recesses) are formed in a repeated pattern in the surface of the sapphire substrate. As shown in FIGS. 11A and 11B, the recesses 123 or the protrusions 122 may have various shapes, such as a dot-shape (see FIG. 11A), a grid-shape, a stripe-shape, a honeycomb-shape, modified shapes of a honeycomb-shape and a grid-shape (see FIG. 11B).

Figure 9C:
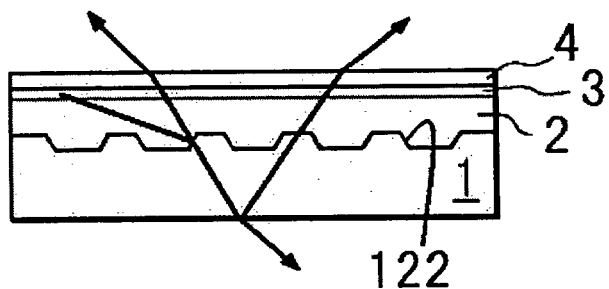
Figure 9D:
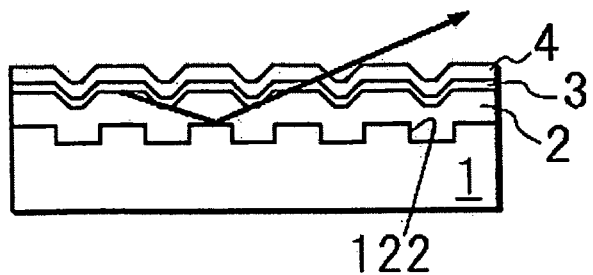
Figure 12A:
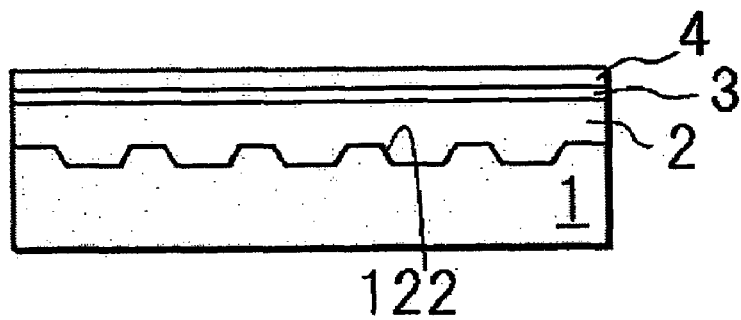
FIGS. 12A to 12C are partial cross sectional views showing semiconductor light emitting devices according to yet another embodiment of the present invention.
Figure 12B:
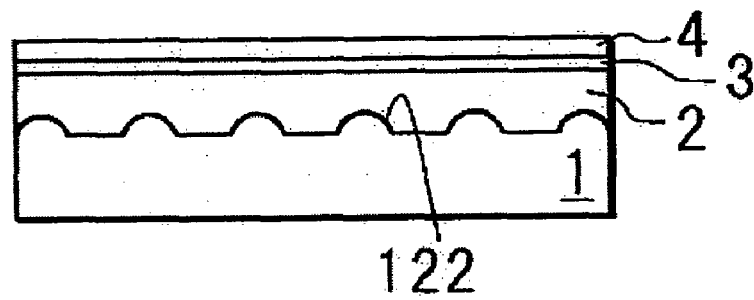
Figure 12C:
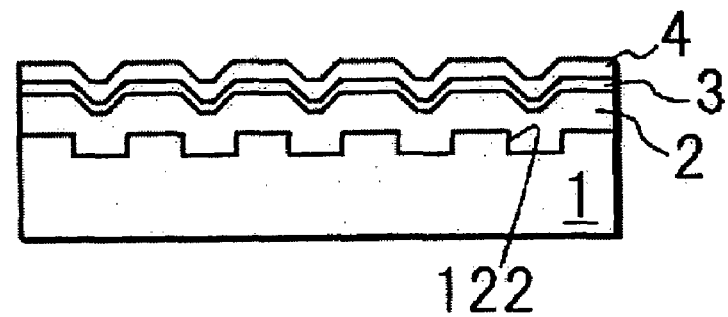

As shown in FIGS. 12A to 12C, in the recesses and protrusions, the protrusions may have inclined side surfaces as in FIG. 12A or a semicircular shape as in FIG. 12B. Further, as shown in FIG. 12C, the n-type semiconductor layer 2, the light emitting region 3 and the p-type semiconductor layer 4 may have a shape with recesses and protrusions due to the protrusions 122. With this configuration, as shown in FIGS. 9C and 9D, light can be extracted efficiently.

Especially, in FIG. 12A, the surfaces connected to the surfaces of the protrusions and recesses (side surfaces of recesses or protrusions) at the boundaries which are lines crossing a plane approximately in parallel with the stable growth surface of the semiconductor layer, are formed so as to incline relative to the direction in which the semiconductors are stacked. With this configuration, the effect of scattering or diffracting light significantly is increased, and the effect in extracting light is greatly increased. One contributing factor is thought that by increasing the surface area of the surfaces between the top of the protrusions and the bottom of the recesses (that is, the side surfaces of the recesses or the protrusions), the number of occurrence of scattering or diffracting light is increased. In other words, the cross-sectional shape of the recesses and protrusions is, as shown in FIG. 12A, a trapezoid is preferable for the protrusions and a reversed trapezoid is preferable for the recesses. By forming the cross-sectional shapes in this manner, the probability of occurrence of scattering and diffraction of propagating light can be increased, and the absorption loss of light during its propagation can be reduced.

Figure 14:
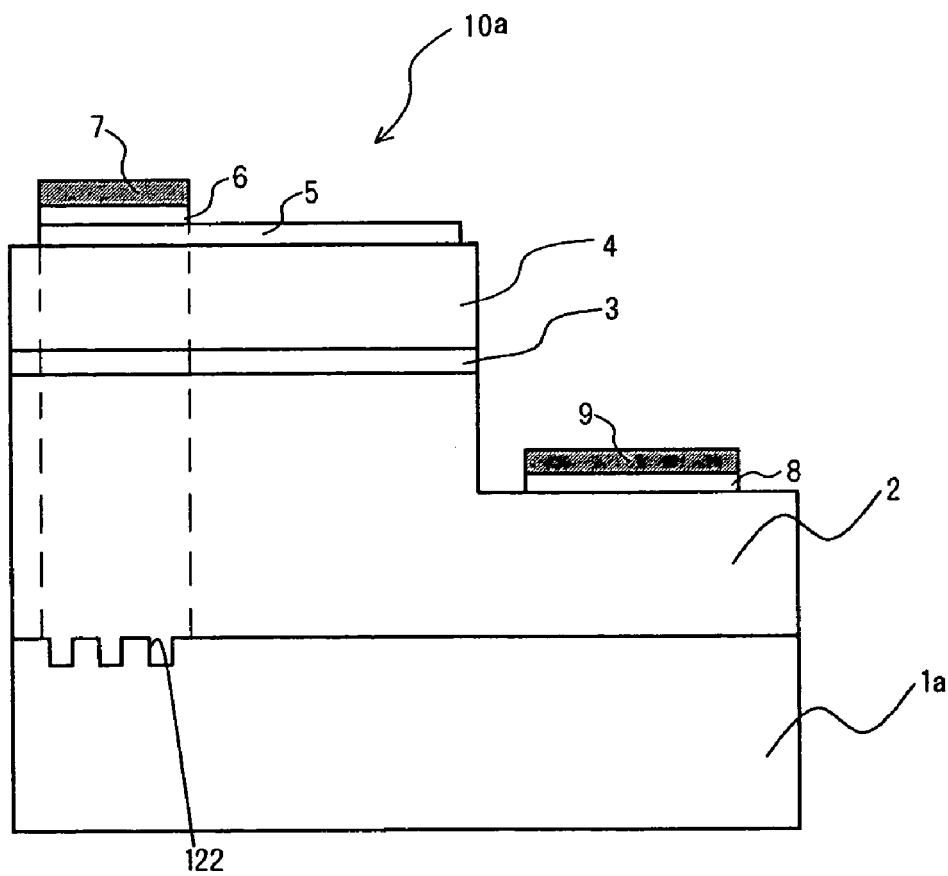
FIG. 14 is a cross-sectional view showing a semiconductor light emitting device according to yet another embodiment of the present invention.
Figure 15:
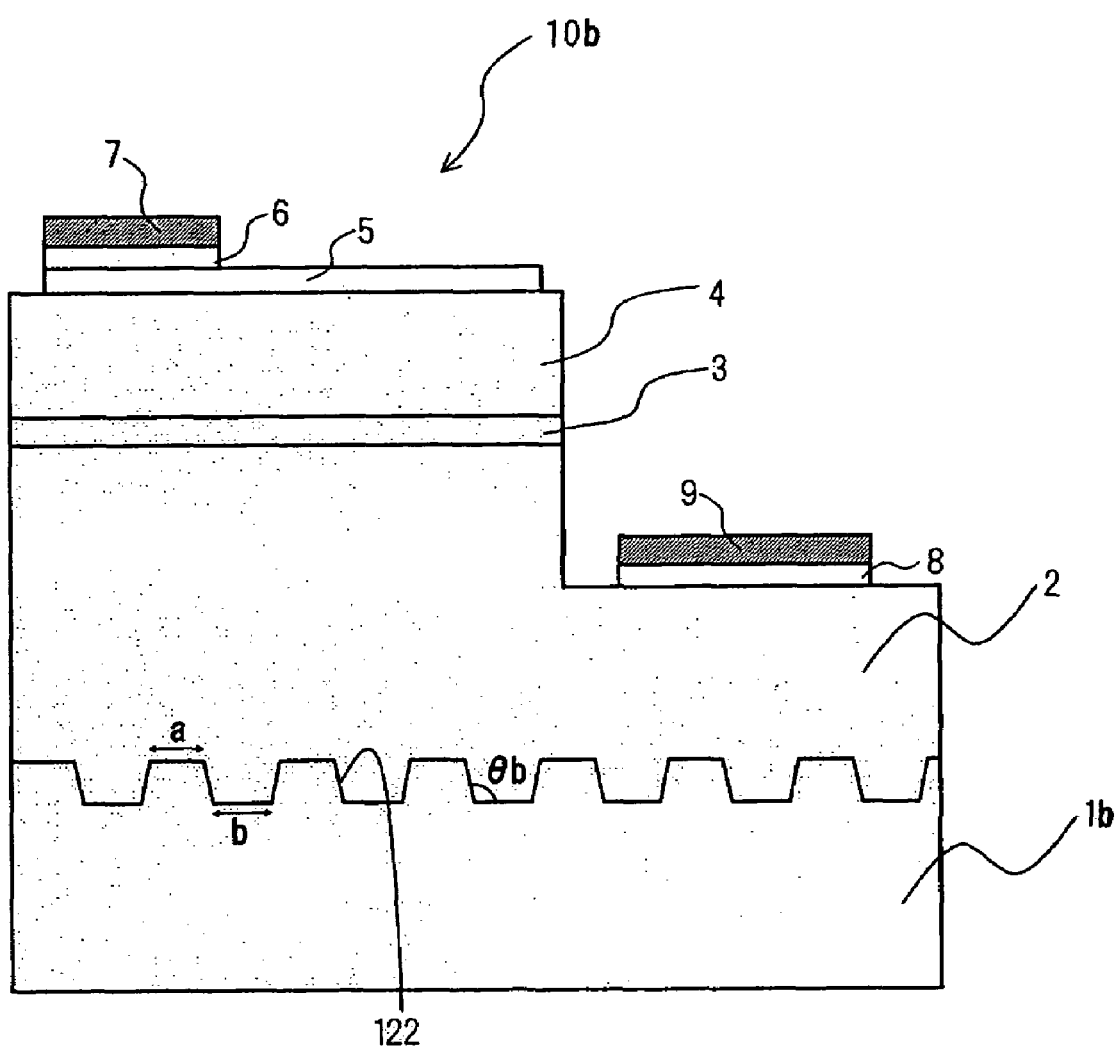
FIG. 15 is a cross-sectional view showing a semiconductor light emitting device according to Example 4 of the present invention.

The recesses and protrusions are formed either in the interface beneath the metal film 7 as shown in the semiconductor light emitting device 10a in FIG. 14, in other words, at least in a part of the interface between the substrate 1a and the semiconductor layer which is, when viewed from the electrode forming surface side, the corresponding opposite portion from the region where the metal film and the upper conductive oxide film are disposed, or in the entire surface of the interface between the substrate 1b and the semiconductor layer as shown in the semiconductor light emitting device 10b in FIG. 15. With this configuration, the direction light traveling in the lateral direction can be changed to the vertical direction by scattering or diffracting the light at the recesses and protrusions. Thus, the amount of light entering the interface between the metal film 7 and the upper layer of ITO film 6 can be increased and the light extraction efficiency can be improved.

The depth of recesses or the step of protrusion are preferably 50 Å or more and less than the thickness of the semiconductor layers grown on the substrate, in order to obtain sufficient scattering and diffraction of light and to improve the luminous efficiency without affecting the lateral flow of the electric current within the layered structure. The depth of recesses or the step of protrusion are preferably $\lambda/4$ ($\lambda$ is wavelength of the emitted light, for example, in AlGaInN-based light emitting layer, 206 nm to 632 nm) or more in order to sufficiently scatter or diffract light. However, the effects of scattering or diffraction can be obtained with $\lambda/4n$ or more (n is index of refraction of the semiconductor layer).

In addition, the size of the recesses and/or the protrusions (that is, the length of one edge of a recess and/or protrusion) and the intervals between the recesses and/or the protrusions are preferably $\lambda/4$ or more, when the emission wavelength of the semiconductor layer is $\lambda$ (380 nm to 460 nm). With this, light can be scattered or refracted sufficiently. However, the effects of scattering or diffraction can be obtained in cases where the sizes and the intervals of the recesses and protrusions are $\lambda/4$ or greater (n is index of refraction of the semiconductor layer). In addition, in the semiconductor light emitting device according to the present invention, light can be extracted further efficiently in combination of a plurality of recesses and protrusions formed on the second region and the recesses and protrusions formed in the interface between the substrate and the semiconductor layer.

In the semiconductor light emitting device according to the present invention, at least the exposed surface of the lower conductive oxide film disposed on the second conductive type semiconductor layer may be covered with a resin. For example, in cases where the conductive oxide film is ITO, a resin whose refractive index is between about 2.0 of ITO and 1.0 of air, such as silicon (refractive index of 1.4 to 1.6) is disposed at least on the exposed surface of the lower conductive oxide film. With this, the resin functions as a cushioning material and the amount of light reflected at the interface between the lower conductive oxide film and air decreases. Thus, light can be extracted more efficiently. In general use, surroundings of a semiconductor light emitting device are sealed with a sealing resin made of an organic resin such as silicon resin, epoxy resin, etc., in order to protect the semiconductor light emitting device from its environment. Further, an optical conversion member can be included into the resin so as to form an optical conversion layer.

Figure 16:
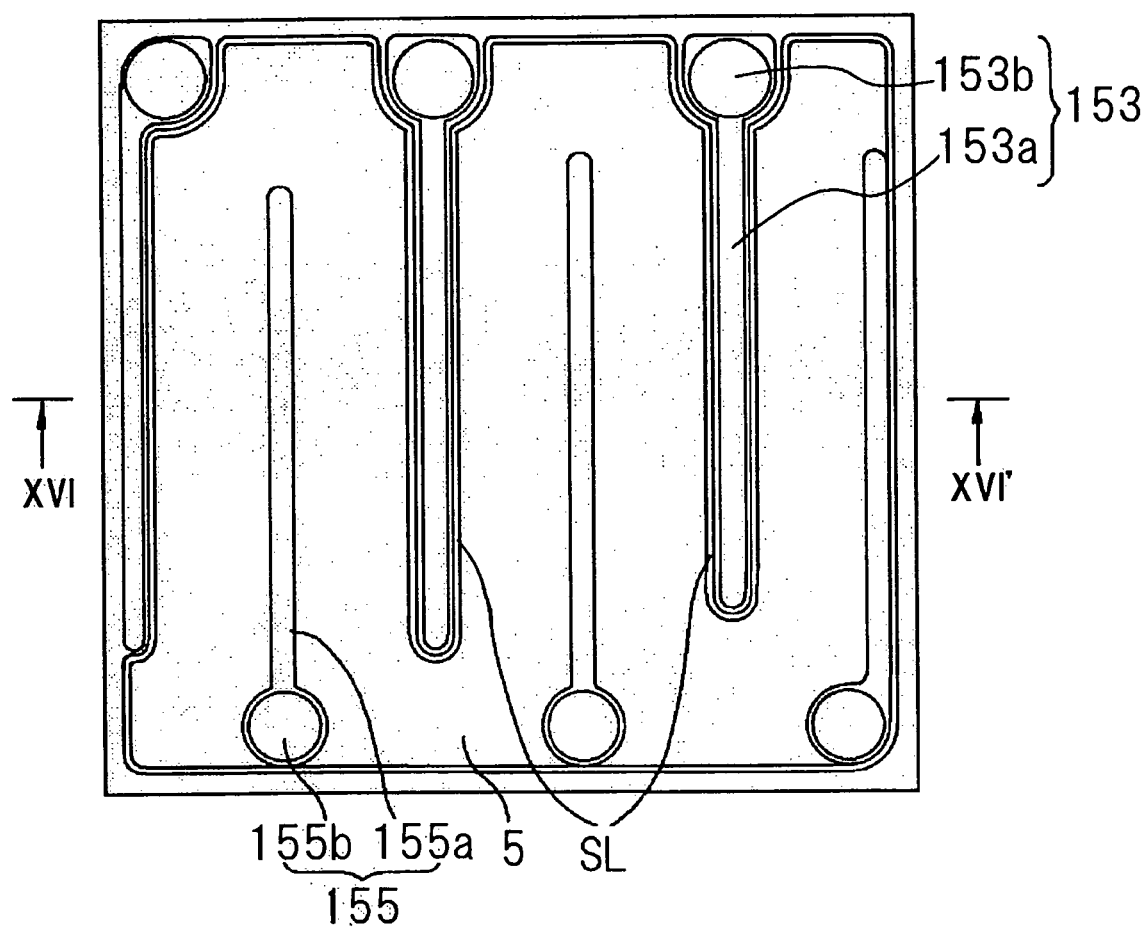
FIG. 16 is a plan view showing a semiconductor light emitting device according to yet another embodiment of the present invention.
Figure 17:
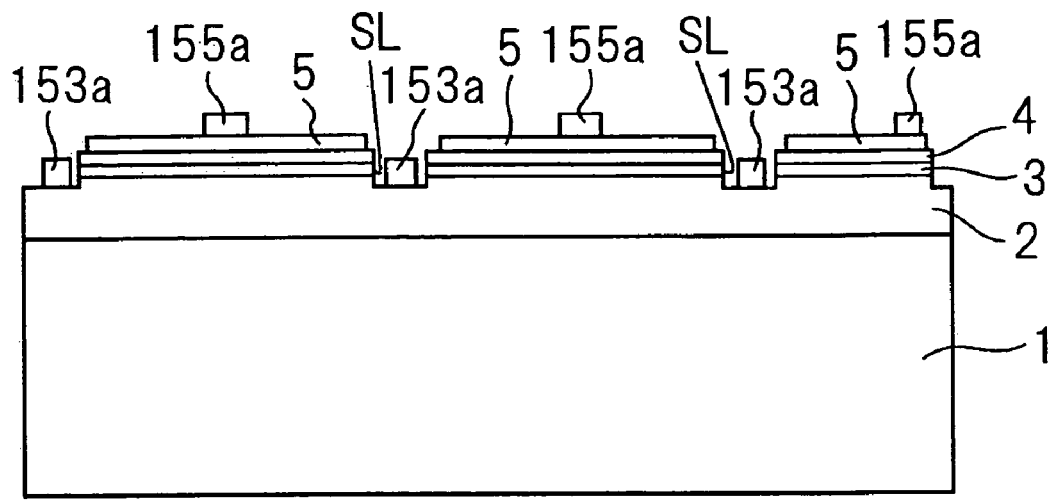
FIG. 17 is a partial cross sectional view taken along line XVI-XVI in FIG. 16.

In addition, as shown in FIG. 16 and FIG. 17, in the semiconductor light emitting device according to the present invention, the p-side pad electrode 155b comprising the upper conductive oxide film and the metal film thereon and the n-side electrode may be disposed so as to extend in a branch-shape in the predetermined direction and respectively oppositely (153a and 155a in FIGS. 16 and 17). Hereinafter, the p-side pad electrode 155b may be referred as the current diffusion electrode, and the n-side electrode may be referred as the n-line electrode.

The semiconductor light emitting device shown in FIGS. 16 and 17 has the structure in which the n-type semiconductor layer 2, light emitting layer 3 and the p-type semiconductor layer 4 are stacked in this order on the substrate 1. A portion of the surface of the n-type semiconductor layer 2 is exposed and a plurality of separately-placed n-line electrodes are disposed thereon.

In other words, in the layered structure comprising the n-type semiconductor layer 2, the light emitting layer 3, and the p-type semiconductor layer 4, a plurality of slits SL are formed by removing portions of the p-type semiconductor layer 4 and the light emitting layer 3 in the form of lines, and portions of the n-type semiconductor layer are exposed therefrom. Then, the n-line electrode 153 is disposed on each exposed surface of the n-type semiconductor layer. In addition, a portion of the n-type semiconductor layer is exposed in a predetermined width along the edge that is parallel to a slit (a edge of the light emitting device and is hereinafter referred to as the first edge), and an n-line electrode 153 is also disposed thereon. In addition, the edge opposite the first edge will be referred to as the second edge.

In this semiconductor light emitting device, the n-line electrode forming regions in the exposed surface of the n-type semiconductor layer are in parallel with a plurality of slits SL, and the interval between the n-line electrode forming region and the slits SL is the same as the interval between adjacent slits SL.

Each n-line electrode 153 comprises the extended conductive portion 153a and the n-side pad electrode 153b. Here, the extended conductive portion 153a (hereinafter referred to as n-side extended conductive portion) comprises the conductive oxide film and/or the metal film. The n-side pad electrode 153b comprises the conductive oxide film and/or the metal film, and is disposed on an edge of the n-side extended conductive portion 153a. The n-side pad electrode 153b is disposed on one end of each n-side extended conductive portion along the edge (the third edge) that is perpendicular to the first edge.

In addition, one end of the n-side extended conductive portion 153a is formed broadly, and then the n-side pad electrode 153b is disposed thereon.

The p-side electrode comprises the lower conductive oxide film 5, that is transparent and formed on approximately the entire surface of the p-type semiconductor layer, and a plurality of current diffusion electrodes 155 formed on the lower conductive oxide film 5. The current diffusion electrodes 155 comprise a plurality of extended conductive portions (hereinafter referred to as the p-side extended conductive portion) 155a that are formed in parallel with the n-side extended conductive portions 153a, and the p-side pad electrode 155b disposed at an end of each p-side extended conductive portion 155a. The p-side extended conductive portions 155a and the p-side pad electrodes 155b comprise the upper conductive oxide film and the metal film having substantially the same shape as the upper conductive oxide film. The gaps between the p-side extended conductive portion 155a and the adjacent n-line electrodes 153 are made of like size, one of a plurality of p-side extended conductive portion 155a is formed along the second edge, and the other p-side extended conductive portions 155a are formed between the n-line electrodes 153. In other words, when an n-line electrode is formed along one of the two opposite edges (the first edge), a current diffusion electrode 155 will be formed along the other edge. In addition, the p-side pad electrodes 153 disposed on one end of each p-side extended conductive portion 155a are formed along a fourth edge opposite the third edge on which the n-side pad electrodes 153b of the n-side electrode are formed.

In this type of semiconductor light emitting device, for the reasons below, the electric current can be applied to the entire light emitting region and the light extraction efficiency can be improved, and an uniform light emission can also be made across the entire light emitting surface, even with a nitride semiconductor light emitting element having a relative large surface area (e.g., 1000 μm×1000 μm).

First, the metal film 153b are respectively formed on one end of each n-line electrode 153, and the metal film 155b are respectively formed on one end of each p-side extended conductive portion 155a. In this way, electric current can be applied to the entire light emitting region approximately uniformly.

In addition in this semiconductor light emitting device, the distance between the metal film 153b and the further end of the n-side extended conductive portions 153a can be made substantially equal in the n-line electrodes 153, and the distance between the metal film 155b and the other end of the p-side extended conductive portion 155a can be made substantially equal in the current diffusion electrodes, and thus the electric current can be applied uniformly to the entire light emitting region.

Here, the aforementioned distance being substantially equal does not mean an identical distance, but implies a distance within a range in which inhomogeneous electric current due to differences in distance does not occur.

Second, the gaps between one end of the p-side extended conductive portions 155a (the further end from the end on which the p-side pad electrode is disposed) and the n-side pad electrodes are made equal, so as to apply the electric current uniformly to the entire light emitting region.

In other words, the n-side extended conductive portion 153a and the p-side extended conductive portion 155a are formed in straight lines such that angled portions and curved portions are not formed along the electrodes, and thus concentrated electric fields and non-uniform electric fields that occur in angled portions and curved portions can be prevented, and associated occurrence of non-uniformity in the electric current can be prevented.

In addition, the distances between the other ends of the p-side extended conductive portion 155a (the ends located on the side opposite the ends on which the p-side pad electrodes 155b are formed) and the n-side pad electrodes 153b (the ends of the n-line electrode 153 on which the n-side pad electrodes 153b are formed) are set to be approximately equal with the gaps between the p-side extended conductive portion 155a and the n-line electrodes 153.

Furthermore, the distances between the other ends of the n-line electrodes 153 (the ends located on the side opposite the ends on which the n-side pad electrodes 153b are formed) and the p-side pad electrodes 155b (the ends of the p-side extended conductive portion 155a on which the p-side pad electrodes 155b are formed) are set to be approximately equal with the gaps between the p-side extended conductive portion 155a and the n-line electrodes 153.

With this configuration, the distances between the current diffusion electrodes 155 and the n-line electrodes 153 can be substantially equal at any portion thereof. Therefore, electric current can be applied approximately uniformly to the entire light emitting region so that uniform light emission can be made possible.

As just described, in the semiconductor light emitting device, protrusions are formed in the second region with the same height as the surface of the lower conductive oxide film in the first region. With this configuration, light taken into the protrusions from the n-side contact layer can be extracted easily from the tops of the protrusions, so that the light extraction efficiency from the electrode disposing surface side can be further improved.

Figure 18:
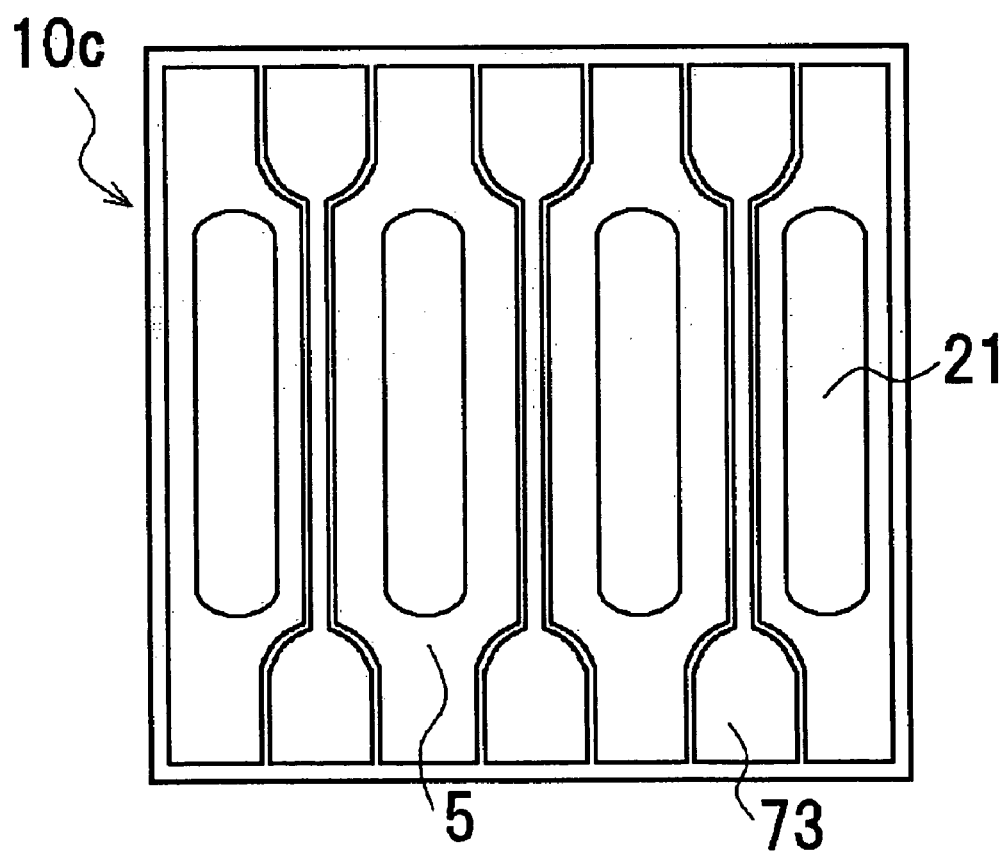
FIG. 18 is a plan view showing a semiconductor light emitting device according to yet another embodiment of the present invention.

Further, in the semiconductor light emitting device according to the present invention, as shown in FIG. 18, the p-type semiconductor layer may be formed so as to be divided by the exposed portions of the n-type semiconductor layer.

In the semiconductor light emitting device 10c, the n-side electrode 73 is formed on the exposed n-type semiconductor layer, and the lower conductive type oxide film 5 and the p-side pad electrode 21 are formed on the p-type semiconductor layer. The lower conductive oxide semiconductor films 5 are in a stripe shape with wider portion than the width of the exposed n-type semiconductor layers in the central part of the semiconductor light emitting device. The number of the stripes of the lower conductive oxide film 5 is greater than that of the n-side electrode 73 on the n-type semiconductor layer.

As described above, the surface are of the lower conductive oxide film 5 can be increased by forming the n-side electrode 73 having a constricted shape, and thus the amount of electric current applied to the light emitting device per unit time can be increased. Furthermore, in the light emitting surface, by decreasing the surface area of the n-type semiconductor layer that does not contribute to the light emission of the semiconductor light emitting device, and relatively increasing the area of the p-type semiconductor layer, the light extraction efficiency of the semiconductor light emitting device can be improved. Thus, with this semiconductor light emitting device, high luminosity can be achieved. In addition, by providing the lower conductive oxide film 5 as described above, the electric current applied to the semiconductor light emitting device can be uniformly diffused in the entire surface of the light emitting device, and thus the emission of light from the light emitting surface of the semiconductor light emitting device can be made uniform.

The upper conductive oxide film and the metal film are formed on the lower conductive oxide film. In cases where such semiconductor light emitting device is mounted in a flip-chip manner, the upper conductive oxide film and the metal film formed on the lower conductive oxide film can reflect light from the light emitting layer toward the p-side electrode side to the substrate side. Thus, amount of light extracted from the substrate side can be increased.

In addition, in the semiconductor light emitting device as shown in FIG. 18, when protrusions comprising layers from the n-side contact layer to the metal film are formed in the surface of the n-side contact layer whereon the electrode is disposed, light taken into the protrusion from the n-side contact layer can be reflected toward the substrate side. Therefore, the effect of light extraction can be further improved. Moreover, when the thickness of the lower layer and the upper conductive oxide film of the protrusions are the same as the thickness of the lower and upper conductive oxide films on the light emitting region, the effect of light extraction can be further improved.

Examples of the first conductive type semiconductor layer, the light emitting layer, and the second conductive type semiconductor layer, that construct the semiconductor light emitting device include the layered structures described in (1) to (5) below.

(1) A buffer layer made of GaN with a thickness of 200 Å, an n-side contact layer made of Si doped n-type GaN layer with a thickness of 4 μm, a light emitting layer having a single quantum well structure and made of undoped $In_{0.2}Ga_{0.8}N$ with a thickness of 30 Å, a p-type cladding layer made of Mg doped p-type $Al_{0.1}Ga_{0.9}N$ with a thickness of 0.2 μm, and a p-side contact layer made of Mg doped p-type GaN with a thickness of 0.5 μm.

(2) A buffer layer made of AlGaN with a thickness of about 100 Å, an undoped GaN layer made with a thickness of 1 μm, an n-side contact layer made of GaN containing $4.5\times10^{18}/cm^3$ of Si with a thickness of 5 μm, an n-side first multilayer made of three layers—a bottom layer made of an undoped GaN of 3000 Å, a middle layer made of GaN containing $4.5\times10^{18}/cm^3$ of Si with a thickness of 300 Å, and an upper layer made of undoped GaN of 500 Å (an overall thickness of 3350 Å), an n-side second multilayer having a superlattice structure in which ten layers each of a 40 Å nitride semiconductor layer made of undoped GaN and a 20 Å nitride semiconductor layer made of undoped $In_{0.1}Ga_{0.9}N$ are repeatedly alternately stacked and a 40 Å nitride semiconductor layer made of undoped GaN is formed thereon (an overall thickness of 640 Å), a light emitting layer having a multiquantum well structure in which six layers each of a 250 Å barrier layer made of undoped GaN and a 30 Å well layer made of $In_{0.3}Ga_{0.7}N$ are repeatedly alternately stacked and a 250 Å barrier layer made of undoped GaN is formed thereon (an overall thickness of 1930 Å), an p-side multilayer having a superlattice structure in which five layers each of a 40 Å nitride semiconductor layer made of $Al_{0.15}Ga_{0.85}N$ containing $5\times10^{19}/cm^3$ of Mg and a 25 Å nitride semiconductor layer made of $In_{0.03}Ga_{0.97}N$ containing $5\times10^{19}/cm^3$ of Mg are repeatedly alternately stacked and a 40 Å nitride semiconductor layer made of $Al_{0.15}Ga_{0.85}N$ containing $5\times10^{19}/cm^3$ of Mg is formed thereon (an overall thickness of 365 Å), and a p-side contact layer made of GaN containing $1\times10^{20}/cm^3$ of Mg with a thickness of 1200 Å.

(3) A buffer layer made of AlGaN with a thickness of about 100 Å, an undoped GaN layer with a thickness of 1 μm, an n-side contact layer made of GaN containing $4.5\times10^{18}/cm^3$ of Si with a thickness of 5 μm, an n-side first multilayer made of three layers of lower bottom layer made of an undoped GaN of 3000 Å, a middle layer made of GaN containing $4.5\times10^{18}/cm^3$ of Si with a thickness of 300 Å, and an upper layer made of undoped GaN with a thickness of 50 Å (an overall thickness of 3350 Å), an n-side second multilayer having a superlattice structure in which ten layers each of a 40 Å nitride semiconductor layer made of undoped GaN and a 20 Å nitride semiconductor layer made of undoped $In_{0.1}Ga_{0.9}N$ are repeatedly alternately stacked and a 40 Å nitride semiconductor layer made of undoped GaN is formed thereon (an overall thickness of 640 Å), an active layer having a multiquantum well structure in which a barrier layer made of undoped GaN with a thickness of 250 Å is formed, and then six layers each of a well layer made of $In_{0.3}Ga_{0.7}N$ with a thickness of 30 Å, a first barrier layer made of $In_{0.02}Ga_{0.98}N$ with a thickness of 100 Å, and a second barrier layer made of undoped GaN with a thickness of 150 Å are repeatedly alternately stacked (an overall thickness of 1930 Å)(three to six layers are preferably repeatedly alternately stacked), an p-side multilayer having a superlattice structure in which five layers each of a 40 Å nitride semiconductor layer made of $Al_{0.15}Ga_{0.85}N$ containing $5\times10^{19}/cm^3$ of Mg and a 25 Å nitride semiconductor layer made of $In_{0.03}Ga_{0.97}N$ containing $5\times10^{19}/cm^3$ of Mg are repeatedly alternately stacked and a 40 Å nitride semiconductor layer made of $Al_{0.15}Ga_{0.85}N$ containing $1\times10^{19}/cm^3$ of Mg with a thickness of 1200 Å. Furthermore, by arranging a bottom layer made of undoped GaN of 3000 Å as a lower layer of the three-layer structure comprising the bottom layer of a first layer made of undoped GaN of 3000 Å, a second layer made of GaN containing $5\times10^{17}/cm^3$ of Si of 100 Å, and a third layer made of undoped GaN of 1500 Å, fluctuation of Vf that proceeds with duration of operation can be controlled.

(4) A buffer layer, an undoped GaN layer, an n-side contact layer made of GaN containing $6.0\times10^{18}/cm^3$ of Si, an undoped GaN layer (an n-type nitride semiconductor layer of an overall thickness of 6 nm), a light emitting layer having a multiquantum well structure in which five layers each of a GaN barrier layer containing $2.0\times10^{18}/cm^3$ of Si and a InGaN well layer are repeatedly alternately stacked, and a p-type nitride semiconductor layer made of GaN containing $5.0\times10^{18}/cm^3$ of Mg with a thickness of 1300 Å, and may also include a InGaN layer between a translucent conductive layer and a p-type nitride semiconductor layer with a thickness of 50 Å. Thus, when using an InGaN layer with a thickness of 50 Å, it can be placed in contact with a positive electrode, so as to be a p-side contact layer. As just described, even a layer undoped with Mg can function as the p-type semiconductor layer in the p-side electrode, provided that the layer is relatively thinner than that of adjacent p-type semiconductor layer.

(5) A buffer layer, an undoped GaN layer, an n-side contact layer made of GaN containing $1 \times 10^{19}/cm^3$ of Si, an undoped GaN layer (an n-type nitride semiconductor layer of an overall thickness of 6 nm), an light emitting layer having a multiquantum well structure in which seven layers each os a GaN barrier layer containing $3.0 \times 10^{18}/cm^3$ of Si and an InGaN well layer are repeatedly alternately stacked (overall width of 800 Å), and a p-type nitride semiconductor layer made of GaN containing $2.5 \times 10^{20}/cm^3$ of Mg with a thickness of 1300 Å, and may also include a InGaN layer between a transparent conductive layer and a p-type nitride semiconductor layer that is 50 Å in thickness. Thus, when a 50 Å thickness InGaN layer is provided, this layer can be placed in contact with a positive electrode, and will become a p-side contact layer.

In addition, the semiconductor light emitting device of the present invention may also include a light conversion material that converts a portion of light from the light emitting device to light having a different wavelength. In this way, a light emitting device can be obtained in which light of the light emitting device is converted, and by mixing emitted light of the light emitting device and the converted light, a light emitting device can be obtained that emits white light, light bulb colored light, or the like.

Examples of the light conversion member includes an aluminum garnet type phosphor containing Al and at least one element selected from Y, Lu, Sc, La, Gd, Tb, Eu, and Sm, and at least one element selected from Ga and In, and an aluminum garnet type phosphor containing at least one element selected from the rare earth elements. In this way, even if in using at a high output in the state of a high heat generation, a light emitting device can be obtained that has superior temperature characteristics and superior durability.

In addition, the light conversion member may be a phosphor represented by $(Re_{1-x}R_x)_3(Al_{1-y}Ga_y)_5O_{12}$ ($0<x<1$, $0 \leq y \leq 1$, however, Re is at least one element selected from the group consisting of Y, Gd, La, Lu, Tb, and Sm, and R is Ce or Ce and Pr). In this way, as noted above, a high output light emitting device having superior temperature characteristics and durability can be obtained, and in particular, when the active layer is InGaN, the temperature characteristics will change in accordance with the blackbody radiation, and thus will be advantageous with white light emission.

Furthermore, the light conversion member may be a nitride phosphor containing N, at least one element selected from Be, Mg, Ca, Sr, Ba, and Zn, and at least one element selected from C, Si, Ge, Sn, Ti, Zr, and Hf, and is activated by at least one element selected from the rare earth elements. A more specific example is the general formula $L_xSi_yN_{(2/3X+4/3Y)}$:Eu or $L_xSi_yO_zN_{(2/3X+4/3Y-2/3Z)}$:Eu (L is Sr or Ca, or either of Sr and Ca). In this way, as in the aforementioned phosphor, a high output light emitting device having superior temperature characteristics and durability can be obtained. Among the above, a silicon nitride oxide compound is preferred. In addition, by using it in combination with aforementioned aluminum garnet phosphors, the temperature characteristic of both materials can be exerted. Accordingly, a light emitting device can be obtained in which the fluctuation of mixed color due to the temperature changes will be small.

Examples of the semiconductor light emitting device according to the present invention will now be described below. It should be noted, however, that the present invention is not limited to these examples.

EXAMPLES

A GaN layer was formed on a sapphire substrate with a thickness of 5.5 μm, an ITO film was formed on the entire surface thereof as a lower conductive oxide film, and further, an ITO film and a Pt film were formed thereon as an upper conductive oxide film, respectively with a thickness shown in Table 1. Thus, samples (a) to (d) were obtained.

Reflectance of each sample was measured by vertically irradiating light of 460 nm from the sapphire substrate side and detecting the reflected light. Reflectance was measured with the spectrophotometer (UV-2400PC) made by Shimadzu Corporation. The results are shown in Table 1.

The thickness of the ITO film of the lower layer was set to about 1670 Å by substituting each value; wavelength of light as 460 nm, A as an odd number 3, and index of refraction of ITO film as 2.06, for the aforementioned condition (1). That is, the thickness of the lower ITO film was set to $3\lambda/4n$. Here, the distance of phase shift was not considered.

In addition, in sample (a), the thickness of the upper ITO film was set to 948 Å. That is, the thickness of the upper ITO film as $2\lambda/4n=\pm\alpha/2$, index of refraction of platinum of 1.87, attenuation coefficient k of platinum of 3.20, and the aforementioned wavelength were substituted for the aforementioned equations (3) and (4). The thickness of the upper ITP film was set by subtracting the thickness corresponding to the distance of phase shift ($\alpha/2=336$ Å) from a multiple of odd number of $\lambda/4n$ (1116 Å). Thus, the total film thickness was set to a multiple of odd number of $\lambda/4n$.

In sample (b), for comparison, the upper ITO film was not provided.

In sample (c), the thickness was set to 390 Å. That is, the thickness of the upper ITO film was set as $1\lambda/4n=\pm\alpha/2$, and the total film thickness was set by subtracting the thickness corresponding to the distance of phase shift from a multiple of odd number of $\lambda/4n$ (558 Å).

In sample (d), the thickness was set to 558 Å. That is, the thickness of the upper ITO film was set as $1\lambda/4n$, and the total film thickness was set to a multiple of even number of $1\lambda/4n$.

| Sample (total film thickness of ITO film) | Lower ITO film (Å) | Upper ITO film (Å) | Pt film (Å) | Reflectance (%) |
|---|---|---|---|---|
| a ($5\lambda/4n$) | 1670 | 948 | 2000 | 55 |
| b ($3\lambda/4n \pm \alpha/2$) | 1670 | — | 2000 | 52 |
| c ($4\lambda/4n \pm \alpha/2$) | 1670 | 390 | 2000 | 45 |
| d ($4\lambda/4n \pm \alpha/2$) | 1670 | 558 | 2000 | 48 |

From the results shown in Table 1 with samples (a) and (b), it was confirmed that in the case where ITO film is used as the upper and lower conductive oxide films, Pt is used as the metal film, and the total thickness of ITO film is set to a multiple of odd number of $\lambda/4n$, the reflectance can be improved.

Especially, as shown with sample (a), it was conformed that the phase shifts depending on the complex refractive index of the metal film and the refractive index of ITO film can be canceled out at the thickness of the ITO film that optimizes the reflectance. With this, reflectance between the ITO film and platinum film was further increased, so that the light extraction efficiency was greatly improved.

Example 1

A semiconductor light emitting device of this example is shown in FIG. 1.

The semiconductor light emitting device 10 is formed by stacking, in this order, onto a sapphire substrate 1, a buffer layer (not shown in the figures) made of $Al_{0.1}Ga_{0.9}N$ and an undoped GaN (not shown in the figures). On top of that are stacked an n-type contact layer made of Si doped GaN and a superlattice n-type cladding layer in which a GaN layer (40 Å) and a InGaN layer (20 Å) are alternately stacked ten times as an n-type semiconductor layer 2. On top of that are stacked an active layer 3 having a multiquantum well structure in which a GaN layer (250 Å) and an InGaN layer (30 Å) are alternately stacked three to six times, and then, stacked thereon are a superlattice p-type cladding layer in which $Al_{0.1}Ga_{0.9}N$ layer doped with Mg (40 Å) and InGaN layer doped with Mg (20 Å) are alternately laminated ten times, as a p-type semiconductor layer 4.

A p-side electrode is disposed on the p-type semiconductor layer 4, in which a lower ITO film 5 (film thickness of 1670 Å) is disposed on the entire surface thereof, and an upper ITO film 6 (film thickness of 948 Å) is disposed only on a portion of the lower ITO film 5, and further, a metal film 7 (film thickness of 2000 Å) made of Pt having approximately the same size as the upper ITO film 6 is disposed on the upper ITO film 6.

Here, it is preferable that a portion in the lower ITO 5 film adjacent to the interface with the p-type semiconductor layer has a lower density than that in a portion adjacent to the surface thereof and in the upper ITO film 6, or a plurality of voids are formed. By forming the lower ITO film 5 in this manner, the electric current density between the p-type semiconductor layer and the lower ITO film 5 can be increased. Accordingly, Schottky barrier can be reduced and the ohmic characteristic can be improved.

Moreover, it is preferable that a portion of lower ITO film 5 adjacent to its surface and the upper ITO film 6 are free from the voids and have a higher density than that in the portions adjacent to the interface between the lower ITO film 5 and the p-type semiconductor layer. By forming a portion of lower ITO film 5 adjacent to its surface and the upper ITO film 6 in this manner, transmittance of visible light can be improved. Accordingly, light can be reflected at the metal film efficiently.

In a portion of the n-type semiconductor layer 2, the light emitting layer 3 and the p-type semiconductor layer 4 which are stacked on the n-type semiconductor layer are removed. Further, a portion of the n-type semiconductor layer in the thickness direction is removed and exposed. An electrode comprising ITO film 8 with 390 Å in thickness and the metal film 9 made of Pt with 2000 Å in thickness are disposed on the n-type semiconductor layer 2.

This type of semiconductor light emitting device can be fabricated according to the method for manufacturing below.

(Formation of the Semiconductor Layer)

First, A sapphire substrate having a principal surface in the C-plane 2 inches in diameter is placed in a MOVPE reaction vessel. The temperature is adjusted to 500° C., and using trimethylgallium (TMG), trimethylaluminum (TMA), and ammonia ($NH_3$), a buffer layer made of $Al_{0.1}Ga_{0.9}N$ is grown to a thickness of 100 Å on the substrate.

After the buffer layer is grown, the temperature is adjusted to 1050° C., and using TMG and ammonia, an undoped GaN layer is grown to a thickness of 1.5 μm. This layer is used as a foundation layer (growth substrate) in growing each layer constructing the device structure.

Next, as an n-type semiconductor layer 2, an n-side contact layer and an n-type cladding layer are grown on the foundation layer. An n-side contact layer made of GaN doped with $1 \times 10^{18}/cm^3$ of Si is grown to a thickness of 2.165 μm on the foundation layer at 1050° C., using TMG, ammonia, and silane gas as an impurity. The temperature is adjusted to 800° C. and an intermittent flow of trimethylindium as a raw material gas is supplied and an n-type cladding layer 5 of 640 Å in thickness is grown thereon by alternately stacking a GaN layer (40 Å) and a InGaN layer (20 Å) ten times to form a superlattice structure. Then, a light emitting layer 3 having a multiquantum well structure is grown thereon by alternately stacking GaN layer (250 Å) and InGaN layer (30 Å) three to six times.

As a p-type semiconductor layer 4, a superlattice p-type cladding layer of 0.2 μm in thickness is grown by alternately stacking an $Al_{0.1}Ga_{0.9}N$ layer doped with Mg (40 Å) and an InGaN layer doped with Mg (20 Å) ten times.

Lastly, at 900° C. and in a hydrogen atmosphere, 4 cc of TMG, 3.0 liters of ammonia, a carrier gas of 2.5 liters of hydrogen gas are supplied, and a p-side contact layer made of p-type GaN doped with $1.5 \times 10^{20}/cm^3$ of Mg is grown on the p-type cladding layer to a thickness of 0.5 μm.

The wafer obtained is then annealed at 600° C. in a nitrogen atmosphere in a reaction vessel to further reduce the resistance of the p-type cladding layer and the p-side contact layer.

(Etching)

After annealing, the wafer is removed from the reaction vessel, a mask of a predetermined shape is formed on the surface of the p-side contact layer which is the top layer, etching is carried out from the top of the mask in an etching device, and a portion of the n-side contact layer is thereby exposed.

After the mask is removed, the wafer is placed in a sputter device, and an oxide target made of a sintered compact of $In_2O_3$ and $SnO_2$ is placed inside the sputter device. Sputtering is carried out in the sputter device in an oxygen atmosphere, with a mixed gas of argon and oxygen (20:1) as the sputter gas, and for example at an RF power of 10 W/cm² for 20 minutes to form a lower ITO film 5 of 1670 Å in thickness.

Next, a mask of resist having predetermined pattern is disposed over the p-side contact layer including the lower ITO film 5 and the n-side contact layer. Then, using an oxide target made of a sintered compact of $In_2O_3$ and $SnO_2$, sputtering is carried out in an oxygen atmosphere while maintaining the temperature of the wafer at 300° C., with a mixed gas of argon and oxygen (20:1) as the sputter gas, and the RF power is changed to at an RF power of 2 W/cm² for 20 minutes. The mask and the ITO formed thereon is then removed by way of lift-off. With this, an upper ITO film 6 and ITO film 8 are disposed on a portion of the lower ITO film 5 and on the n-side contact layer respectively with a thickness of 947 Å.

Further, by employing the same lift-off method as described above, using Pt target, metal films 7 and 9 are disposed on the upper ITO film 6 and the ITO film 8 with a thickness of 2000 Å. Then, a heat treatment is carried out in a lamp annealing apparatus at 400 to 600° C. The obtained wafer is divided at predetermined places so as to obtain the semiconductor light emitting devices 10.

By observing a cross-section of the semiconductor device fabricated as described above by STEM, a plurality of voids of 20 to 200 nm in size can be seen in the lower ITO film 5 that is the lower conductive oxide film. Thus, low density of this portion can be confirmed. The upper ITO film 6 that is the upper conductive oxide film and the ITO film 8 that is the conductive oxide film have a high density and excellent crystallinity. The p-side electrode is transparent.

According to the structure of the semiconductor light emitting device of the present invention, both of the adhesion between the p-side electrode and the p-side contact layer and the adhesion between the n-side electrode and the n-side contact layer can be strengthened. Especially, the electric current density between the lower ITO film which is the lower conductive oxide film and the p-side contact layer will be increased, so that the Schottky barrier can be decreased, and the contact resistance between the lower ITO film and the p-side contact layer can be decreased.

Further, as a comparative example, a semiconductor light emitting device is formed without the upper ITO film 6 which is the upper conductive oxide film and ITO film 8. By measuring the light extraction efficiency of this device and that of the aforementioned present invention, higher light extraction efficiency of the semiconductor light emitting device of the present invention described above can be confirmed.

Example 2

The semiconductor light emitting device of this example is fabricated in the same manner as in Example 1, except that the metal film of the p-side electrode and the metal film of the n-side electrode are disposed in the separate steps.

A mask of a resist having a predetermined pattern is disposed on the upper ITO film 6, and the metal film 7 made of Rh(1000 Å)/Pt(2000 Å)/Au(5000 Å) is formed thereon.

Then, the metal film 7 comprising a W layer of 200 Å, a Pt layer of 2000 Å, and an Au layer of 5000 Å stacked in this order is disposed on the ITO film 8 that is disposed on the b-side contact layer.

A semiconductor light emitting device obtained in this manner has a similar effect as in Example 1.

As described above, according to the structure of the semiconductor light emitting device of the present invention, the adhesion between the positive electrode and the p-side contact layer and between the n-side electrode and the n-side contact layer can be strengthened. Especially, the electric current density between the lower ITO film which is the lower conductive oxide film and the p-side contact layer can be increased, so that the Schottky barrier can be reduced, and the contact resistance between the lower ITO film and the p-side contact layer can be reduced. In addition, the sheet resistance is low due to the metal film, and the electric current can be diffused uniformly within the surface in the positive electrode, so that the light emitting layer can emit light efficiently. Further, the light extraction efficiency can also be improved.

Example 3

As shown in FIG. 5, in the semiconductor light emitting device of the present example, the p-side electrode 20 and the n-side electrode 19 are provided in the same surface side. The semiconductor light emitting device has a construction, in which the light is extracted from the electrode forming surface side as an observation side. The layered structure of semiconductor in the semiconductor light emitting device comprises a GaN buffer layer 12, a undoped GaN layer 13, an Si-doped GaN layer 14 as an n-side contact layer, an Si-doped GaN layer 15 as an n-type cladding layer, an InGaN layer 16 as a light emitting layer, a Mg-doped GaN layer 18 as p-side contact layer are successively stacked on a sapphire substrate 1. Furthermore, the Mg-doped GaN layer 18, the Mg-doped AlGaN layer 17, the InGaN layer 16, the Si-doped GaN layer 15, and the Si-doped GaN layer 14 are partially removed by etching etc., the n-side electrode 19 is disposed on the exposed surface of the Si-doped GaN layer 14, and the n-side electrode 20 is disposed on the Mg-doped GaN layer 18.

The n-side electrode 19 comprises the ITO film and the metal film which are successively stacked from the n-side contact layer side, as in Example 1. The metal film of the n-side electrode 19 comprises W, Pt, and Au, which are successively stacked from the n-side contact layer. The p-side electrode 20 comprises the lower conductive oxide film 5 disposed on approximately the entire surface of the p-side contact layer and the p-side pad electrode 21 comprising the upper conductive oxide film 6 and the metal film 7. Further, the metal film 7 of the p-side electrode comprises W, Pt, and Au, which are successively stacked in the same manner as the n-side electrode. In addition, in this example, in order to secure the light emitting region (first region) widely, the lower conductive oxide film 5 of the p-side electrode partially surrounds the n-side electrode 19.

The n-side contact layer has the first region in which the layered structure of semiconductor with the p-side electrode is provided, and the second region different than the first region in view from the electrode forming surface side. The n-side electrode 19 and a plurality of protrusions 29 are provided in the second region. In addition, the protrusions 29 are formed so as to surround the first region. In the semiconductor light emitting device of the present example, the first region that emits light in operation is surrounded by the protrusions. With this configuration, the surface of the electrode forming surface side of the semiconductor light emitting device can be used effectively in controlling the efficiency in light extraction and the directivity of light.

As shown in FIG. 7, the lower conductive oxide film is provided on the top portion of each protrusion 29 formed in the second region. In a cross section of the protrusion, the top portion thereof is made of the lower conductive film having substantially the same thickness as that of the lower conductive oxide film 5 on the first region that emits light. As just described, by forming the protrusions with their tops made of the lower conductive oxide film with the thickness in which light can penetrate easily, light taken into the protrusions from the n-side contact layer can be extracted easily from the top of the protrusions. Accordingly, the light extraction efficiency of the semiconductor light emitting device can be further improved than that of example 1.

As shown in FIG. 5, the semiconductor light emitting device of the present example, the layered structure of semiconductor provided in the first region between the n-side electrode and the pad portion of the p-side electrode preferably has a portion constricted from the n-side electrode along the line V-V' connecting the n-side electrode and the pad portion of the p-side electrode, and a plurality of the protrusions are formed in the constricted portion. With this construction, the light extraction efficiency and the directivity of light can be further improved. The electric current mainly flows along the line V-V'. However, by removing a portion along the line V-V' and forming a plurality of protrusion in the removed area, the light extraction efficiency and the directivity of light can be improved efficiently. It is considered that with this construction, the electric current can be diffused to a wider region in the layered structure of semiconductor, and light of relatively high-intensity emitted from the end surface of the layered structure of semiconductor including the light emitting layer in the region where a portion along the line V-V' has been removed, can be effectively extracted toward the observation side.

Further, provision of a plurality of protrusions in the second region tends to improve electric discharge characteristic of both the forward direction and the reverse direction. Although the reason is not obvious, it is considered to related to the increased surface area due to provision of a plurality of protrusions.

In addition, the semiconductor light emitting device of the present example, the contour thereof is rectangular in view from the electrode forming surface side, and the n-side electrode and the p-side pad electrode are respectively positioned at approximately center in both ends of the longitudinal direction. However, it should be appreciated that this invention is not specifically limited to this construction. For example, the n-side electrode and the p-side pad electrode can be respectively positioned diagonally on a quadrangle.

Example 4

As shown in FIG. 15, a semiconductor light emitting device of the present example 10b has a similar structure as in example 1, except that the recesses and the protrusions are provided in the interface between the substrate 1b and the n-type semiconductor 2. In the present example, a sapphire substrate having C-plane (0001) as the main surface and the orientation flat in A-plane (11-20) is used as the substrate.

The semiconductor light emitting device can be fabricated according to the method for manufacturing below.

First, a $SiO_2$ film that becomes an etching mask is formed on a sapphire substrate 1. Next, a circular photomask of 5 μm in diameter is used and the $SiO_2$ film and the sapphire substrate 1 are etched by 1 μm using RIE. After etching, the $SiO_2$ film is removed. With this, a repeating pattern of protrusions 122 each having a circular planar shape and recesses 123 is formed. Here, the diameter a of the tops of the protrusions is 5 μm, and the interval b between the protrusions is 2 μm. The angle of inclination of the side surface of the recesses is 120°.

Figure 13:
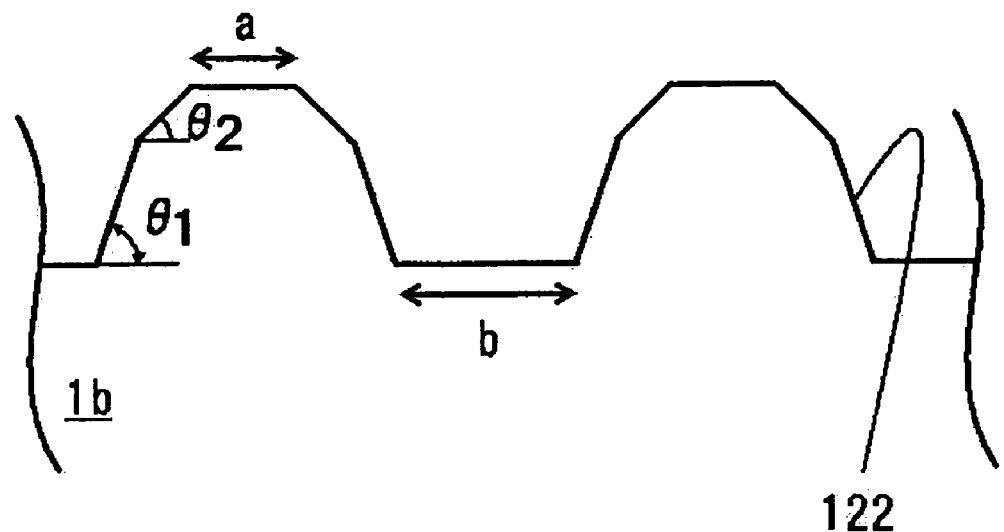
FIG. 13 is a cross-sectional view of an example of the recesses and protrusions.

As shown in FIG. 13, the repeating pattern of the protrusions can be formed in which the side surfaces of the protrusions are formed with two inclined planes with different angles. In this case, for example, after the $SiO_2$ film is removed, a further etching is carried out on the surface of the sapphire substrate 1b, so that resulting protrusions have the top diameter a=3 μm, the interval between the protrusions b=1.5 μm, angle $\theta_1$=70° and angle $\theta_2$=20° in the side surfaces of the protrusions. With this configuration, not only the light extraction efficiency described later but also the semiconductor device structure grown on the substrate having the protrusions, especially the crystallinity of the semiconductor layer therein can be improved, and the internal quantum efficiency can be improved.

Next, on the obtained sapphire substrate 1, a buffer layer grown at a low temperature and made of $Al_xGa_{1-x}N$ ($0 \leq x \leq 1$) of 100 Å, an undoped GaN of 3 μm, Si doped GaN of 4 μm, and undoped GaN of 3000 Å are stacked in sequence as the p-type semiconductor layer 2. Subsequently, as the light emitting layer 3 having multiquantum well structure which becomes a light emitting region, six well layers and seven barrier layers are alternately stacked, in which a well layer is made of undoped InGaN with a thickness of 60 Å and a barrier layer is made of Si doped GaN with a thickness of 250 Å. In addition, by forming the first layer that is grown on the buffer layer at a low temperature with an undoped GaN, the portions adjacent to the protrusions 122 can be uniformly filled.

Then, as a p-type semiconductor layer 4, Mg doped AlGaN of 200 Å, undoped GaN of 1000 Å, Mg doped GaN of 200 Å are stacked. The undoped GaN layer formed as a p-type semiconductor layer shows p-type characteristics due to diffusion of Mg from the adjacent layers. Next, etching is carried out from the Mg doped GaN layer, the p-type semiconductor layer 4, and the light emitting layer 3, to a portion of the n-type semiconductor layer so as to expose Si doped GaN layer. Then, a p-side electrode comprising a lower ITO film 5, an upper ITO film 6, and a metal film 7, and an electrode comprising an ITO film 8 and a metal film 9 are formed in a same manner as in example 1. The wafer is divided at predetermined places so as to obtain the semiconductor light emitting devices 10.

In the semiconductor light emitting device obtained in such a manner, light traveling toward the interface between the metal film and the upper ITO film or toward the surface of the substrate at an angle larger than the critical angle is scattered or diffracted by the recesses and the protrusions provided in the interface between the substrate and the semiconductor layer, and enter the interface between the metal layer and the upper ITO film at an angle smaller than the critical angle. Thus, the light extraction efficiency can be further improved than that of the semiconductor light emitting device in example 1.

The semiconductor light emitting devices according to the present invention can ideally used to form various types of light sources, such as backlights, displays, lighting, and automobile headlights, and the like.

It is to be understood that although the present invention has been described with regards to preferred embodiments thereof, various other embodiments and variants may occur to those skilled in the art, which are within the scope and spirit of the invention, and such other embodiments and variants are intended to be covered by the following claims.

This application is based on Japanese Patent Application No. 2004-094514 filed on Mar. 29, 2004, the contents of which are incorporated hereinto by reference.

What is claimed is:

1. A semiconductor light emitting device comprising:
    a first conductive type semiconductor layer, a light emitting layer, and a second conductive type semiconductor layer stacked in this order;
    electrodes respectively connected to the first conductive type and the second conductive type semiconductor layers;
    the electrode connected to said second conductive type semiconductor layer comprising a lower conductive oxide film, an upper conductive oxide film disposed on said lower conductive oxide film so that a portion of a surface of said lower conductive oxide film is exposed, and a metal film disposed on said upper conductive oxide film; and
    said upper conductive oxide film and said lower conductive oxide film each comprising an oxide including at least one element selected from the group consisting of zinc (Zn), indium (In), tin (Sn), and magnesium (Mg).

2. The semiconductor light emitting device according to claim 1, wherein the electrode connected to said first conductive type semiconductor layer comprises a first conductive oxide film and a metal film disposed on said first conductive oxide film, and said first conductive oxide film included in said electrode connected to said first conductive type semiconductor layer comprises an oxide including at least one element selected from the group consisting of zinc (Zn), indium (In), tin (Sn), and magnesium (Mg), and said upper conductive oxide film and said first conductive oxide film have substantially the same composition and substantially the same thickness.

3. The semiconductor light emitting device according to claim 2, wherein the upper conductive oxide film and the first conductive oxide film are made of an indium tin oxide.

4. The semiconductor light emitting device according to claim 2, wherein the metal film is at least one of a single-layer film and a multi-layer film made of W, Rh, Ag, Pt, Pd, and Al.

5. The semiconductor light emitting device according to claim 1, wherein the lower conductive oxide film has a thickness described by $$A \cdot \lambda/4n_1 \pm X \quad (1)$$

(wherein A is an odd number, λ is a wavelength of light emitted from the light emitting layer (Å), $n_1$ is refractive index of the lower conductive oxide film, X is film thickness (Å) which is 0 to 20% of an optical thin film (λ/4n)).

6. The semiconductor light emitting device according to claim 5, wherein the upper conductive oxide film has a thickness described by $$B \cdot \lambda/4n_2 + \alpha/2 \quad (2)$$

(wherein B is an even number, λ is the wavelength of light emitted from the light emitting layer (Å), $n_2$ is the refractive index of the upper conductive oxide film, and α is distance of phase shift (Å)).

7. The semiconductor light emitting device according to claim 6, wherein the upper conductive oxide film and the lower conductive oxide film are made of an indium tin oxide.

8. The semiconductor light emitting device according to claim 5, wherein the lower conductive oxide film is made of an indium tin oxide.

9. The semiconductor light emitting device according to claim 1, wherein the lower conductive oxide film has a lower density adjacent to an interface with the second conductive type semiconductor layer than that adjacent to its surface.

10. The semiconductor light emitting device according to claim 1, wherein the upper conductive oxide film has a higher density than a portion of the lower conductive oxide film adjacent to an interface with the second conductive type semiconductor layer.

11. The semiconductor light emitting device according to claim 1, wherein the upper conductive oxide film and the lower conductive oxide film are made of an indium tin oxide.

12. The semiconductor light emitting device according to claim 1, wherein the metal film is at least one of a single-layer film and a multi-layer film made of W, Rh, Ag, Pt, Pd, and Al.

13. The semiconductor light emitting device according to claim 1, wherein the first conductive type semiconductor layer is an n-type semiconductor layer and the second conductive type semiconductor layer is a p-type semiconductor layer, and
wherein the semiconductor layer is a nitride semiconductor layer.

14. The semiconductor light emitting device according to claim 1, wherein the first conductive type semiconductor layer is disposed on a substrate, and protrusions are disposed on at least a portion of an interface between said substrate and the first conductive type semiconductor layer.

15. The semiconductor light emitting device according to claim 14, wherein said protrusions are disposed on at least a surface of the substrate that is below the metal film disposed on the upper conductive oxide film.

16. The semiconductor light emitting device according to claim 1, wherein the electrode connected to the first conductive type semiconductor layer and the electrode connected to the second conductive type semiconductor layer are disposed on a common surface side,
said first conductive type semiconductor layer comprises a first region provided with the stacked layer structure of semiconductor having the upper conductive oxide film and the lower conductive oxide film and a second region that is different than said first region, and
a plurality of protrusions are provided in said second region.

17. The semiconductor light emitting device according to claim 16, wherein said protrusions provided in the second region are made of substantially the same material as the semiconductor layer in the first region, and upper portions of said protrusions are made of substantially the same material as the lower conductive oxide film.

18. A semiconductor light emitting device comprising:
a first conductive type semiconductor layer, a light emitting layer, and a second conductive type semiconductor layer stacked in this order;
electrodes respectively connected to the first conductive type and the second conductive type semiconductor layers;
the electrode connected to said second conductive type semiconductor layer comprising a lower conductive oxide film, an upper conductive oxide film disposed on said lower conductive oxide film so that a portion of a surface of said lower conductive oxide film is exposed, and a metal film disposed on said upper conductive oxide film; and
said upper conductive oxide film and said lower conductive oxide film each comprising an oxide including at least one element selected from the group consisting of zinc (Zn), indium (In), tin (Sn), and magnesium (Mg), and
wherein the electrode connected to said first conductive type semiconductor layer comprises a first conductive oxide film and a metal film disposed on said first conductive oxide film, and
said first conductive oxide film included in said electrode connected to said first conductive type semiconductor layer comprises an oxide including at least one element selected from the group consisting of zinc (Zn), indium (In), tin (Sn), and magnesium (Mg), and
wherein the upper conductive oxide film and said first conductive oxide film have substantially the same composition and substantially the same thickness, and
wherein the lower conductive oxide film has a thickness described by $$A \cdot \lambda/4n_1 \pm X \quad (1)$$

(wherein A is an odd number, λ is a wavelength of light emitted from the light emitting layer (Å), $n_1$ is refractive index of the lower conductive oxide film, X is film thickness (Å) which is 0 to 20% of an optical thin film (λ/4n)), and
wherein the upper conductive oxide film has a thickness described by $$B \cdot \lambda/4n_2 + \alpha/2 \quad (2)$$

(wherein B is an even number, λ is the wavelength of light emitted from the light emitting layer (Å), $n_2$ is the refractive index of the upper conductive oxide film, and α is distance of phase shift (Å)).

19. A semiconductor light emitting device comprising:
a first conductive type semiconductor layer, a light emitting layer, and a second conductive type semiconductor layer stacked in this order;
electrodes respectively connected to the first conductive type and the second conductive type semiconductor layers;
the electrode connected to said second conductive type semiconductor layer comprising a lower conductive oxide film, an upper conductive oxide film disposed on said lower conductive oxide film so that a portion of a surface of said lower conductive oxide film is exposed, and a metal film disposed on said upper conductive oxide film; and
said upper conductive oxide film and said lower conductive oxide film each comprising an oxide including at least one element selected from the group consisting of zinc (Zn), indium (In), tin (Sn), and magnesium (Mg) and wherein the lower conductive oxide film has a thickness described by $$A \cdot \lambda/4n_1 \pm X \quad (1)$$

(wherein A is an odd number, λ is a wavelength of light emitted from the light emitting layer (Å), $n_1$ is refractive index of the lower conductive oxide film, X is film thickness (Å) which is 0 to 20% of an optical thin film (λ/4n)), and wherein the upper conductive oxide film has a thickness described by $$B \cdot \lambda/4n_2 + \alpha/2 \quad (2)$$

(wherein B is an even number, λ is the wavelength of light emitted from the light emitting layer (Å), $n_2$ is the refractive index of the upper conductive oxide film, and α is distance of phase shift (Å)), and wherein the metal film is at least one of a single-layer film and a multi-layer film made of W, Rh, Ag, Pt, Pd, and Al.

20. A semiconductor light emitting device comprising:
a first conductive type semiconductor layer, a light emitting layer, and a second conductive type semiconductor layer stacked in this order;
electrodes respectively connected to the first conductive type and the second conductive type semiconductor layers;
the electrode connected to said second conductive type semiconductor layer comprising a lower conductive oxide film, an upper conductive oxide film disposed on said lower conductive oxide film so that a portion of a surface of said lower conductive oxide film is exposed, and a metal film disposed on said upper conductive oxide film; and
said upper conductive oxide film and said lower conductive oxide film each comprising an oxide including at least one element selected from the group consisting of zinc (Zn), indium (In), tin (Sn), and magnesium (Mg);
wherein the electrode connected to said first conductive type semiconductor layer comprises a conductive oxide film and a metal film disposed on said conductive oxide film, and
said conductive oxide film included in said electrode connected to said first conductive type semiconductor layer comprises an oxide including at least one element selected from the group consisting of zinc (Zn), indium (In), tin (Sn), and magnesium (Mg).

* * * * *